(12) United States Patent
Kamieniecki

(10) Patent No.: US 8,896,338 B2
(45) Date of Patent: Nov. 25, 2014

(54) ELECTRICAL CHARACTERIZATION OF SEMICONDUCTOR MATERIALS

(76) Inventor: Emil Kamieniecki, Bedford, MA (US)

(*) Notice: Subject to any disclaimer, the term of this patent is extended or adjusted under 35 U.S.C. 154(b) by 371 days.

(21) Appl. No.: 13/523,180

(22) Filed: Jun. 14, 2012

(65) Prior Publication Data

US 2013/0257472 A1    Oct. 3, 2013

Related U.S. Application Data

(60) Provisional application No. 61/617,262, filed on Mar. 29, 2012.

(51) Int. Cl.
*G01R 31/02* (2006.01)

(52) U.S. Cl.
USPC ............ 324/762.01; 324/750.02; 324/762.05; 347/132; 257/E21.053

(58) Field of Classification Search
USPC .......................... 324/762.01, 750.02, 762.05; 347/129–135; 257/21; 458/478
See application file for complete search history.

(56) References Cited

U.S. PATENT DOCUMENTS

| 6,104,206 A * | 8/2000 | Verkuil ............... 324/762.05 |
| 7,026,831 B2 * | 4/2006 | Hermes ............... 324/754.23 |
| 7,898,280 B2 * | 3/2011 | Kamieniecki ............ 324/762.01 |
| 2011/0301892 A1 | 12/2011 | Kamieniecki | |

* cited by examiner

*Primary Examiner* — Arleen M Vazquez
*Assistant Examiner* — Alesa Allgood
(74) *Attorney, Agent, or Firm* — Kriegsman & Kriegsman

(57) ABSTRACT

A method for characterizing the electronic properties of a semiconductor sample by exploiting transients in measured photoconductance, the transients being induced by illuminating the semiconductor sample with a small probing illumination that is superimposed over a larger background illumination. In one embodiment, a pulse-type probing illumination is utilized, with either the intensity of the probing illumination being gradually reduced or the intensity of the background illumination being gradually increased until the measured photoconductance rise and decay in the sample are substantially exponential. In another embodiment, a continuous probing illumination with a sinusoidally-modulated intensity is utilized, the modulated intensity of the probing illumination being gradually adjusted until the measured photoconductance is linearly dependent thereupon.

16 Claims, 24 Drawing Sheets

Fig. 1
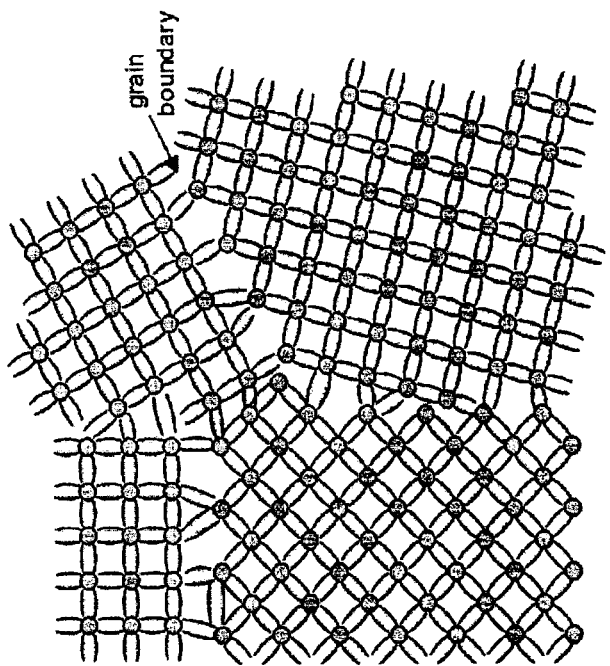
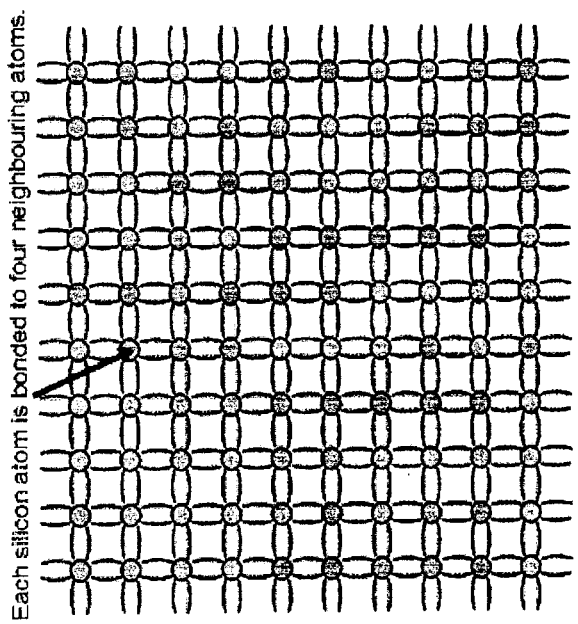

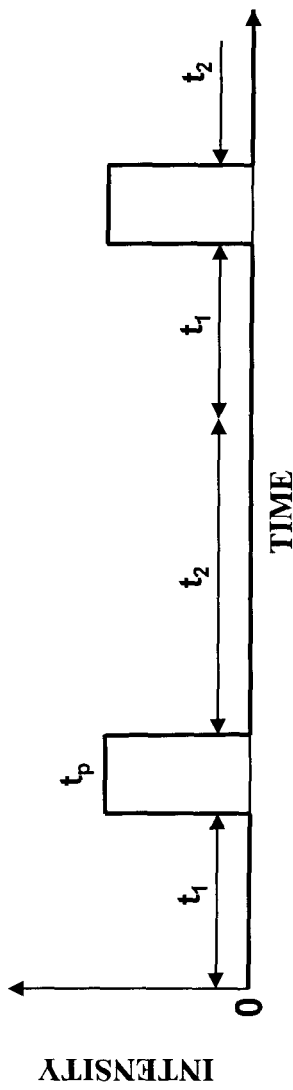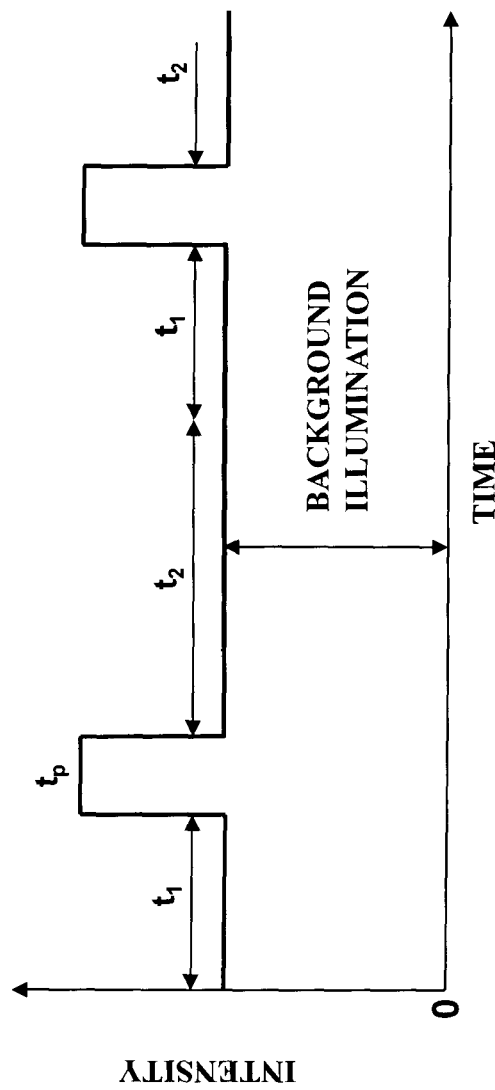

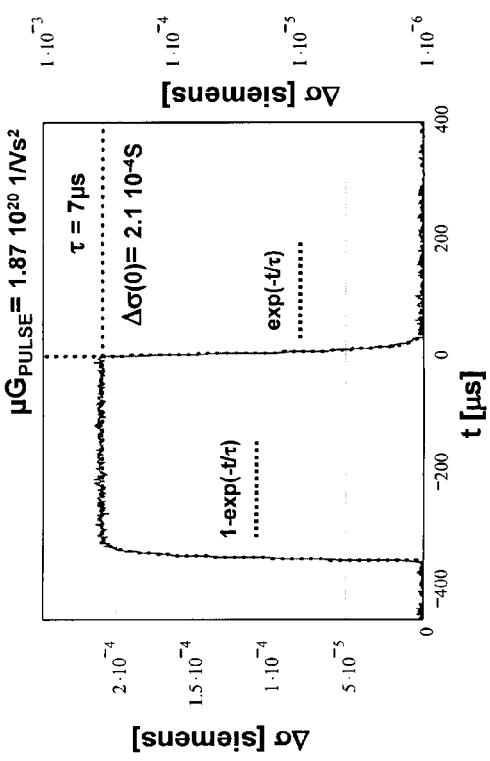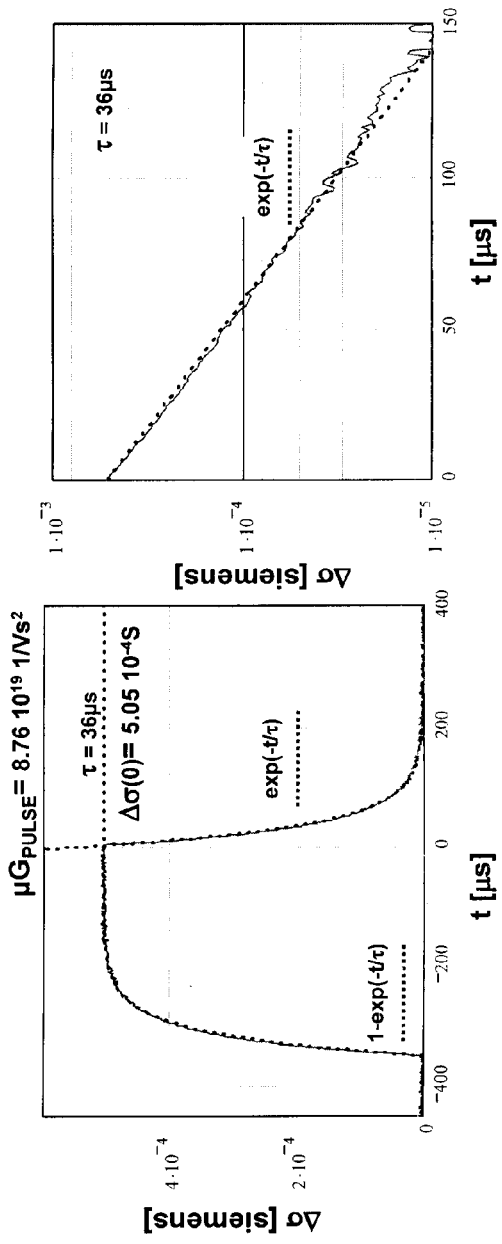
Fig. 21A
Fig. 21B

ELECTRICAL CHARACTERIZATION OF SEMICONDUCTOR MATERIALS

CROSS-REFERENCE TO RELATED APPLICATIONS

The present application claims the benefit of U.S. Provisional Patent Application Ser. No. 61/617,262, which was filed on Mar. 29, 2012 in the name of Emil Kamieniecki, the disclosure of which is incorporated herein by reference.

FIELD OF THE INVENTION

This invention relates to electrical characterization of semiconductor materials.

BACKGROUND

The defining metric of what is competitive in the photovoltaics industry is the cost per kilowatt-hour. The success of a specific photovoltaic technology depends on its ability to reduce the manufacturing cost and increase the efficiency of the solar cells. In the integrated circuit (IC) industry, the cost of the substrate is frequently a negligible fraction of the total manufacturing cost. On the other hand, in the photovoltaics industry, the cost of the substrate material may ultimately determine the viability of the product. The cost and the quality of substrates used for photovoltaic solar cells are critical in the manufacture of the cells.

More than 90% of photovoltaic solar cell manufacturers use silicon as a substrate material, and silicon wafers can account for as much as 45% of the total cost of photovoltaic modules. Hence, reducing the manufacturing cost of substrate materials without sacrificing quality is a potential opportunity for decreasing the cost of photovoltaics. Such an improvement, which is critical for both silicon and thin-film photovoltaics, should be achieved without a substantial reduction of the conversion efficiency of the photovoltaic cells.

Photovoltaic cells can be manufactured using electronic-grade silicon wafers; however, an increasingly common approach to reducing the cost of the photovoltaic substrate material is the use of lower quality (i.e., more impure) silicon sources and the replacement of single crystal silicon with multicrystalline silicon. Multicrystalline silicon can be fabricated by casting ingots and slicing the ingots into wafers. A growing number of manufacturers further reduce the cost of the substrate material by replacing sliced wafers with sheet or ribbon technology, which creates monocrystalline or multicrystalline silicon directly from a silicon melt. One such technology is the "String Ribbon Crystal Growth Technology" used by Evergreen Solar, Inc. Multicrystalline silicon suffers from a higher level of contamination due to the use of a less pure silicon source and also from a higher density of crystalline defects than single crystal (electronic-grade) silicon. Multicrystalline substrates are less expensive to manufacture, but photovoltaic cells made of multicrystalline silicon are also less efficient than cells made from single crystal silicon.

Transition metals are often a main culprit in degrading the efficiency of multicrystalline silicon solar cells. Multicrystalline photovoltaics also suffer from a large density of crystalline defects such as grain boundaries, as illustrated in FIG. 1. The density of grain boundaries, which is related to the size of crystallites in the sample, is one of the major parameters for differentiation between various silicon growth technologies.

The use of thin films of photovoltaic material deposited directly onto rigid or flexible substrates offers additional cost savings. Thin film cells use around one one-hundredth the amount of semiconductor material used in single crystal or multicrystalline cells. Furthermore, in addition to silicon, the deposited photovoltaic material can be other inorganic semiconductors or even organic materials with optical properties better suited to the solar spectrum. In silicon, for instance, the theoretical upper limit of efficiency (i.e., the conversion of light to electricity) under normal full-sun illumination is 31%. This limit is largely a result of the 1.1 eV band gap of silicon, which corresponds to a photon wavelength of 1127 nm. In practice, systems using crystalline silicon as a photovoltaic material are only about 20-25% efficient. In contrast, a more efficient photovoltaic cell is a three junction indium gallium phosphide/indium gallium arsenide/germanium cell, which increases the conversion efficiency to 37%. Fundamentally different devices, however, could have a theoretical efficiency as high as 87%. However, because non-silicon photovoltaic material is often based on compound semiconductors (e.g., copper indium gallium diselenide, or CIGS), the concentration of defects in such thin films can be even higher than the concentration in silicon.

Improving manufacturing processes and increasing manufacturing yields in photovoltaic fabrication requires reliable information regarding critical electrical properties of the substrate materials. One of the most critical parameters, the minority carrier lifetime $\tau$, defines the quality of the photovoltaic substrate material and the efficiency of the solar cells. The minority carrier lifetime, a measure of how long carriers (i.e., electrons and holes) remain before recombining, is highly sensitive to the presence of defects detrimental to device performance. A related parameter, the minority carrier diffusion length, is the average distance a carrier moves from its point of generation before it recombines. The longer the lifetime, the longer the diffusion length, and the higher the probability that optically generated carriers will reach the collection point (i.e., the p-n junction) and produce current in an external circuit. A shorter lifetime translates to a lower conversion efficiency of the solar cell and a poorer economic viability of the product.

The dominant approaches to measurement of the carrier lifetime in the photovoltaic industry are photoconductive decay (PCD) methods. In this technique, electron-hole pairs are created by an optical excitation that changes the conductivity of the sample. The recombination of excess carriers is monitored by measuring the decay of the conductivity after the illumination is turned off. Optical excitation with a pulse having a photon energy that exceeds the energy gap of the semiconductor generates excess electron-hole pairs, increasing the conductivity of the semiconductor (i.e., photoconductance). Relaxation of this photoconductance to the initial equilibrium state is detected using either radio frequency techniques (RF-PCD) or microwave reflectance techniques ($\mu$-PCD). Both RF-PCD and $\mu$-PCD measure an 'effective total lifetime.' In this approach, separation of the bulk lifetime from the surface recombination requires surface passivation, such as immersion of silicon in HF, iodine passivation, or corona charging. Alternatively, the requirement for surface passivation can be reduced by measuring slabs of material at least ten times thicker than standard photovoltaic substrates and using deeply penetrating illumination (i.e., longer wavelength). In $\mu$-PCD, a microwave beam is directed to the sample and the reflected microwave power, which is proportional to the conductance of the sample, is measured. $\mu$-PCD systems, unlike RF-PCD systems, exhibit a non-linear dependence on the injection level, and thus meaningful $\mu$-PCD measurements are limited to a narrow range of excess carrier concentrations.

Another approach to measuring the minority carrier lifetime is the surface photovoltage (SPV) method. SPV measures the minority carrier diffusion length, which is directly related to the minority carrier lifetime and which can be used interchangeably with the lifetime in material characterization. An advantage of SPV over PCD is the ability of SPV to distinguish between bulk and surface carrier recombination. However, SPV requires a sample thickness larger than the carrier diffusion length which, for typical materials used in commercial solar cells (carrier lifetime ~2-5 µs), exceeds the standard thickness of silicon photovoltaic wafers (around 100-200 µm). Additionally, in the SPV method, uncontrolled surface recombination at the wafer backside may strongly interfere with carrier recombination in the bulk, leading to misleading data. Furthermore, extended imperfections such as grain boundaries and dislocations can also interfere with SPV measurements, reducing their reliability.

Differentiation between recombination processes occurring in the bulk of the device and at the interfaces can be accomplished by identifying the dependence of lifetime on the geometry of the device being tested or on the excitation wavelength. Determining the underlying physics of the recombination process can be accomplished by analyzing the dependence of the lifetime on the level of photo-excitation and temperature. Such an approach, while cumbersome and time consuming, is quite effective in the R&D environment; however, it is not suitable for in-line monitoring of the manufacturing process.

The important shortcoming associated with the use of photoconductance decay (PCD) in photovoltaic material characterization is that carrier recombination lifetime is determined from the transient characteristics. The solar cells operate under steady-state conditions and effective carrier lifetime under such conditions may, due to carrier trapping effects, substantially differ from the transient carrier lifetime. This is particularly important in lower quality materials with more defects and impurities frequently leading to carrier trapping effects.

The transient-measurement shortcoming associated with the use of PCD could be overcome by measuring carrier lifetime under steady-state conditions or its close approximate quasi-steady-state method. The quasi-steady-state photoconductance (QSSPC) method measures the dependence of the lifetime (multiplied by the carrier mobility) on the level of photo-excitation from a quasi-steady-state value of the photoconductance. In steady-state, QSSPC, as in the PCD methods, separation of the bulk lifetime from surface recombination requires surface passivation unless performed on slabs of material at least ten times thicker than standard photovoltaic substrates. Additionally, steady state and quasi-steady-state methods are directly dependent on the accurate knowledge of sample reflectivity and light absorption characteristics. Since these characteristics could change during PV cell processing (such as deposition of anti-reflecting coating or annealing) steady-state methods could be subject to substantial measurement errors.

Separation of the effects of surface or extended crystallographic imperfections from the effect of bulk contaminants and bulk point defects is critical for process optimization and control of the fabrication of photovoltaics. The ability to maintain a low concentration of electrically active metallic impurities and crystalline defects is essential for achieving a high yield in semiconductor manufacturing and thus for reducing the cost of photovoltaic devices. It is therefore essential to provide measurement methods that are both accurate and compatible with photovoltaic cell manufacturing process.

Accordingly, in U.S. Pat. No. 7,898,280 to E. Kamieniecki, the disclosure of which is incorporated herein by reference, there is provided a system and method for characterizing electronic properties of a semiconductor sample using photoconductance decay that is able to separate the effects of surface or extended crystal imperfections from the effects of bulk contaminants and bulk point defects. The aforementioned method distinguishes between the effects of point and extended defects in a semiconductor sample by identifying and analyzing the exponential and logarithmic components of measured photoconductance decay after illuminating the surface of the sample with a pulse of light of predetermined duration which has a photon energy level that is higher than the semiconductor material. Specifically, the exponential component of the measured photoconductance decay is utilized to identify point imperfections in the sample and the logarithmic component of the measured photoconductance decay is utilized to identify extended imperfections in the sample.

The material characterization methods described in detail above in connection with photovoltaic cell fabrication are also applicable in fabrication of other devices such as high brightness light emitting diodes (HB-LED), RF power, and HEMT devices. These devices, which frequently require thin film characterization, similarly critically depend on the ability of material characterization methods to separate surface and bulk properties. As in photovoltaics fabrication, where crystalline defects and impurities would reduce conversion efficiency of the cells, the presence of crystalline defects and impurities in high brightness light emitting diodes would similarly reduce quantum efficiency and therefore require control during the fabrication process.

SUMMARY

This invention relates generally to a method and a system for characterizing electronic properties of a semiconductor sample.

In one aspect, a method for characterizing electronic properties of a semiconductor sample includes illuminating the surface of the semiconductor sample with a pulse of light, measuring a photoconductance decay in the semiconductor sample after the cessation of the first pulse of light, and analyzing the photoconductance decay. The electronic properties include properties associated with at least one of the bulk of the semiconductor sample and the surface of the semiconductor sample. The pulse of light has a predetermined duration and photon energy higher than an energy gap of the semiconductor. The analyzing step determines a first component of the photoconductance decay substantially associated with point imperfections in the semiconductor sample and at least one second component of the photoconductance decay substantially associated with extended imperfections in the semiconductor sample.

In embodiments of this aspect of the invention, illuminating the surface of the semiconductor sample and measuring the photoconductance decay is performed at a constant distance from the semiconductor sample.

If the bulk of the semiconductor sample includes only point imperfections and the only extended imperfection is the surface of the semiconductor sample embodiments may include one or more of the following. The electronic properties of the bulk of the semiconductor sample are determined by analyzing the first component of the photoconductance decay and the electronic properties of the surface are determined by analyzing the second component of the photoconductance decay.

If the bulk of the semiconductor sample includes at least one of point imperfections and extended imperfections and the surface of the semiconductor sample is passivated, electronic properties of the bulk of the semiconductor sample associated with point imperfections are determined by analyzing the first component of the photoconductance decay and electronic properties of the bulk of the semiconductor sample associated with extended imperfections are determined by analyzing the second component of the photoconductance decay. The method includes determining a ratio of a first volume of the semiconductor sample in which point imperfections dominate carrier recombination to a second volume of the semiconductor sample in which extended imperfections dominate carrier recombination.

If the electronic properties of the bulk of the semiconductor sample include electronic properties associated with point imperfections and electronic properties associated with extended imperfections in the bulk and the surface of the semiconductor sample is substantially not passivated, the electronic properties associated with point imperfections are determined by analyzing the first component of the photoconductance decay. The electronic properties associated with extended imperfections in the bulk and the electronic properties of the surface of the semiconductor sample are determined by analyzing the second component of the photoconductance decay.

Illuminating the surface of the semiconductor sample includes illuminating the surface of the semiconductor sample with a first pulse of light having a first wavelength and a first intensity. Measuring a photoconductance decay includes measuring a first photoconductance decay. Analyzing the photoconductance decay includes analyzing the first photoconductance decay. The method includes illuminating the surface of the semiconductor sample with a second pulse of light having a second wavelength and a second intensity, measuring a second photoconductance decay in the semiconductor sample after the cessation of the second pulse of light, analyzing the second photoconductance decay to determine a third component of the photoconductance decay substantially associated with extended imperfections in the semiconductor sample, and distinguishing between the electronic properties associated with extended imperfections in the bulk and electronic properties of the surface of the semiconductor sample on the basis of the second component of the photoconductance decay and the third component of the photoconductance decay. At least one of the second wavelength and the second intensity is different from the first wavelength and the first intensity. The method includes determining a ratio of a first volume of the semiconductor sample in which point imperfections dominate charge carrier recombination to a second volume of the bulk of the semiconductor sample in which extended imperfections dominate carrier recombination.

The electronic properties of the surface of the semiconductor sample comprise at least one of a surface charge density, a density of surface traps, and a surface potential barrier. The density of surface traps is used to monitor a surface cleaning or etching processes. The electronic properties of the bulk of the semiconductor sample comprise at least one of a probability per unit time that a majority carrier will be captured by an available point imperfection or extended imperfection, an effective volume of extended imperfections in the bulk of the semiconductor sample, a bulk carrier lifetime, and a subsurface doping concentration. The subsurface doping concentration is determined and used to calibrate an apparatus performing the measurement. The subsurface doping concentration is determined and used to characterize a subsurface region of the semiconductor sample. The subsurface doping concentration is determined and used to characterize a thin film.

The pulse of light has a duration sufficient to achieve steady-state photoconductance in the sample. An interval between consecutive pulses of light is sufficient to allow the sample to substantially reach thermal equilibrium. Measuring the photoconductance decay in the semiconductor sample includes performing the measurement at a distance from the surface of the sample. The distance is between 1 µm and 300 µm, e.g., between 25 µm and 100 µm. The first component of the photoconductance decay is approximated by an exponential function. The second component of the photoconductance decay is approximated by a logarithmic function. The method includes generating inversion conditions at the surface of the semiconductor sample prior to illuminating the surface of the semiconductor sample. The inversion conditions are generated using a chemical treatment or corona charge unless inversion conditions existed prior to the treatment.

Illuminating the surface of the semiconductor sample can further include varying the intensity of the pulse of light, varying the photon energy, or both.

In another aspect, a method for characterizing electronic properties of a semiconductor sample includes illuminating a surface of the semiconductor sample for a duration of time sufficient to establish steady-state photoconductance in the semiconductor sample, measuring a non-linear dependence of a photoconductance in the semiconductor sample on the intensity of the illumination, and analyzing the non-linear dependence of the photoconductance on the intensity of the illumination to determine electronic properties of the semiconductor sample. In an embodiment, the electronic properties of the sample include at least one of a surface charge density, a density of surface electronic traps, a bulk carrier lifetime, or a subsurface doping concentration. In another embodiment, measuring the photoconductance decay in the semiconductor sample includes performing the measurement at a distance from the surface of the sample.

In yet another aspect, a method for characterizing electronic properties of a semiconductor sample includes illuminating a surface of the semiconductor sample with background illumination for a duration of time sufficient to establish steady-state photoconductance in the semiconductor sample, illuminating the sample with an additional, small probing illumination pulse superimposed over the background illumination for a duration sufficient to achieve a new steady-state photoconductance in the sample, measuring the rise and decay of the photoconductance transient associated with the probing pulse, analyzing the rise and decay and, if the rise and decay are not exponential, decreasing probing pulse light intensity until probing photoconductance transient rise and decay becomes exponential. Typically, both background and probing illumination has a photon energy higher than the energy gap of the semiconductor. However, in some lower quality materials, background illumination with a photon energy lower than the energy gap of the semiconductor could be also used.

The above procedure may be not adequate for characterization of some non-crystalline materials or wafers with a p-n junction. In such applications, if the rise and decay of the photoconductance transient associated with the probing pulse are initially non-exponential, exponential rise and decay of the photoconductance generated by a probing pulse is achieved by increasing the background illumination. A gradual increase in the background illumination intensity is performed until photoconductance rise and decay become exponential.

Since the photoconductance that results from a probing illumination pulse represents only a small deviation from the steady-state photoconductance established by background illumination, the time constant of the exponential rise and decay represents the steady-state carrier recombination lifetime. Furthermore, an analysis of the change in steady-state photoconductance due to a probing illumination pulse allows for the determination of the effective generation rate (multiplied by the carrier mobility) due to the probing pulse. Comparing the effective generation rate with the incident photon flux allows for the establishment of effective surface reflectivity (multiplied by the carrier mobility).

In a further aspect, a system for characterizing electronic properties of a semiconductor sample includes a light source, an inductive probe, an RF source, and a controller. The light source is positioned to illuminate the semiconductor sample with a pulse of light having a predetermined duration and photon energy higher than an energy gap of the semiconductor sample, the pulse of light, in one embodiment, being superimposed over background illumination generated by the same or an additional light source. The inductive probe is spaced from the semiconductor sample and positioned to provide an RF signal to the semiconductor sample. The inductive probe is further configured to detect a photoconductance signal from the semiconductor sample in response to the pulse of light. The RF source provides the RF signal having a frequency to the inductive probe. The controller tunes the frequency of the RF signal provided to the inductive probe to maximize the photoconductance signal from the semiconductor sample.

In embodiments of this aspect of the invention, the controller can automatically tune the frequency of the RF signal. The system can further include an RF bridge electrically connected between the RF source and inductive probe. The RF bridge has a resonance branch including the inductive probe and a reference branch including a mechanism for varying the magnitude and phase of the reference branch.

The controller can be configured to control the mechanism for varying the magnitude and phase of the reference branch as well as to control the light source.

The inductive probe includes an optical fiber coupled to the light source and a detector coil and can further include an electromagnetic shield surrounding the optical fiber and the detector coil. The inductive probe is spaced from the semiconductor sample at a fixed distance.

The controller can be configured to perform the steps of illuminating the surface of the semiconductor sample with a pulse of light having a predetermined duration and a photon energy higher than an energy gap of the semiconductor, the pulse of light, in one embodiment, being superimposed over a background illumination with an intensity that is substantially higher than the pulse intensity; measuring a photoconductance decay in the semiconductor sample after the cessation of the first pulse of light; and analyzing the photoconductance decay to determine a first component of the photoconductance decay substantially associated with point imperfections in the semiconductor sample and at least one second component of the photoconductance decay substantially associated with extended imperfections in the semiconductor sample.

In this embodiment, an RF bridge can be electrically connected between the RF source and inductive probe, the RF bridge having a resonance branch including the inductive probe and a reference branch including a mechanism for varying the magnitude and phase of the reference branch. The RF bridge can be further configured to be balanced before measuring the photoconductance decay in the semiconductor sample.

There are a number of advantages that result from the ability to characterize electronic properties of a semiconductor sample. In particular, because the effects of various material imperfections are controlled by different process parameters, effective process control requires the ability to separately monitor the electrical effect of each type of imperfection. Furthermore, because some devices, such as a photovoltaic cell, operate in a steady state mode, effective process control requires the ability to monitor the electrical effects in conditions corresponding to steady state operations and illumination intensity and spectrum corresponding to normal operation of the photovoltaic solar cells. A non-contact, non-destructive system and method as described above can be used for rapid, in-line monitoring and characterization of the carrier lifetime in semiconductor samples. Bulk and surface effects are separated in a single measurement step without requiring surface passivation. The effect of bulk point imperfections on the carrier recombination can be distinguished from the effect of other critical types of material imperfections such as extended imperfections. In more complex wafer structures, bulk point imperfections could be determined from the steady-state carrier lifetime that is measured without precise knowledge of the carrier generation rate and carrier mobility. Such a metrology system and method enables better process optimization and in-line process control of photovoltaic fabrication, improving yields of functioning devices and reducing the cost of photovoltaic solar cells.

BRIEF DESCRIPTION OF DRAWINGS

FIG. 1 is a depiction of imperfections in a semiconductor.

FIGS. 7A and 7B are examples of a measurement pulse sequence provided without and with background illumination, respectively.

FIGS. 21A and 21B are graphs illustrating transient and decay photoconductance measured at two consecutive processing steps in the fabrication of a photovoltaic cell using the system and method of the present invention, the monitored photoconductance using the same background and probing pulse illuminations shown in FIG. 20.

DETAILED DESCRIPTION

Semiconductor Characterization System

Figure 3:
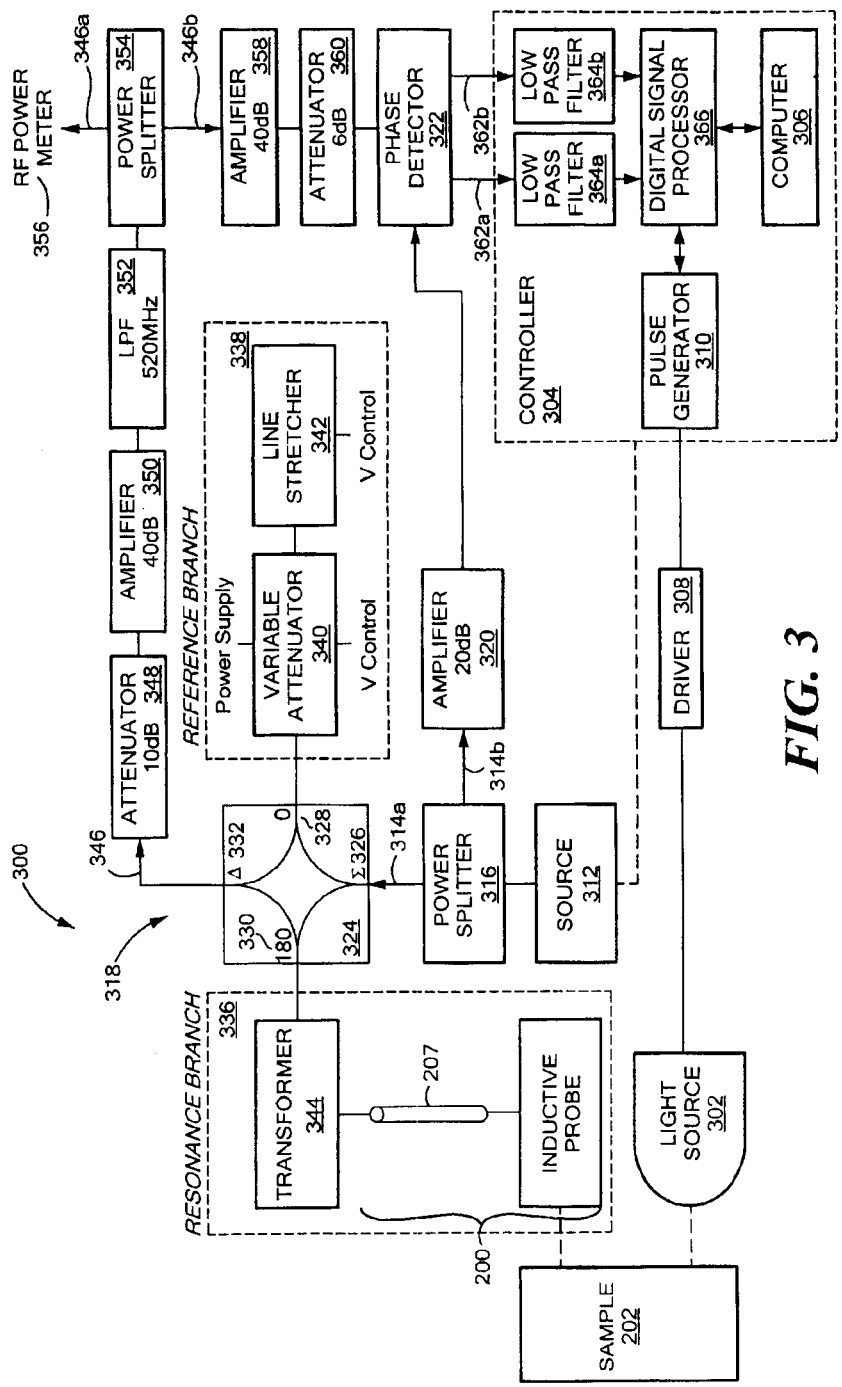
FIG. 3 is a block diagram depiction of a semiconductor characterization system.

A system and a method for measuring the photoconductance of a semiconductor sample are discussed below. Referring for example to FIG. 3, semiconductor sample 202 is illuminated with a pulse of light that, in one application, is superimposed over background illumination from a light source 302 which, in turn, induces photoconductance in the sample. A probe 200, which is inductively coupled to sample 202, senses the change in conductivity as a result of the induced photoconductance. The probe 200 is connected to a controller 304, which processes a signal related to the change in conductivity. The processed signal is then used to determine electronic properties of the semiconductor sample.

Figure 2:
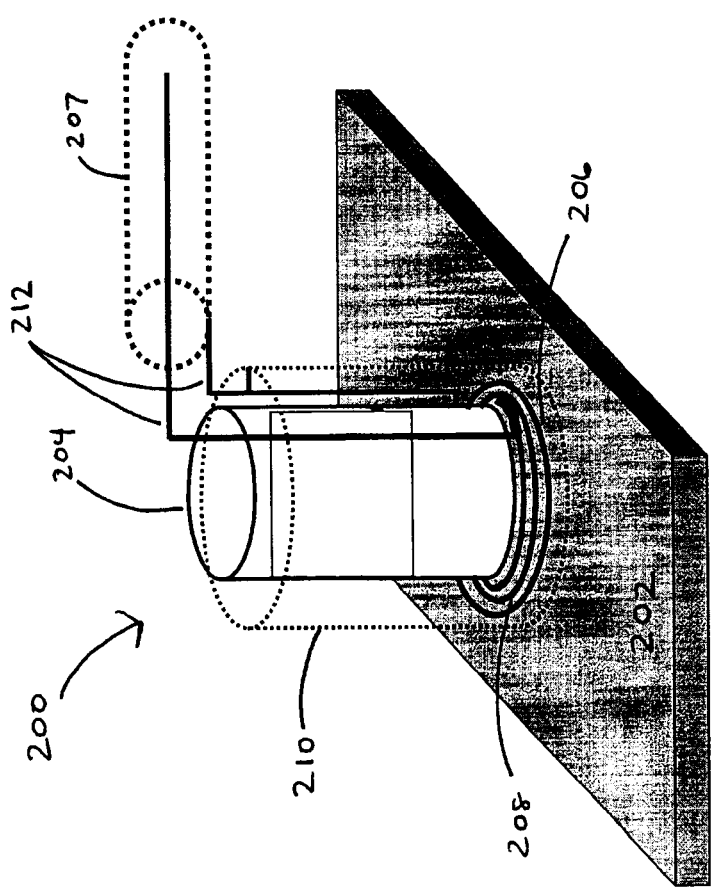
FIG. 2 is a schematic drawing of a probe for measuring the photoconductance of a semiconductor sample.

Referring to FIG. 2, probe 200 for electrical characterization of semiconductor sample 202 operates in the radio frequency (RF) range, and more specifically in the ultrahigh frequency (UHF) range. Probe 200 is inductively coupled to sample 202 to form an inductance-capacitance (LC) resonance circuit that is sensitive to the conductivity of semiconductor sample 202. A voltage of the LC-resonance circuit is linearly related to the conductivity of sample 202 over a broad range of conductivity. Measurements of sample 202 are performed at or near the resonance frequency of the LC circuit. Probe 200 also provides for the illumination of sample 202 with an illumination pulse of light. The illumination pulse induces photoconductance in sample 202 by generating charge carriers in the sample. When the illumination pulse ceases, the photoconductance in sample 202 decays. This change is sensed by the LC circuit and can be analyzed to determine electrical properties of sample 202.

Probe 200 contains an optical fiber 204, such as a 1 mm fused silica fiber or an acrylic fiber having an inner diameter of 1 mm, for illuminating sample 202. A detection coil 206 in the form of a surface coil is coplanar with the end of optical fiber 204 closest to semiconductor sample 202. Detection coil 206 is composed of multiple windings 208 (for instance, approximately three windings, or more specifically approximately 2¾ windings). The axis of optical fiber 204 is aligned with the center of windings 208; optical fiber 204 is held in place relative to windings by a fiber optic collar (not shown). Surrounding optical fiber 204 and detection coil 206 is a cylindrical copper shield 210. An end of one of the windings 208 is electrically connected through connections 212 to copper shield 210 and to a shield of a semi-rigid coaxial cable 207. In another embodiment, copper shield 210 is not grounded. Any space between optical fiber 204, windings 208, and copper shield 210 is filled with an insulating epoxy. The bottom of the insulating epoxy is optically polished to achieve a planar surface at the base of probe 200. The base of probe 200 is adjusted using an optical mount to be parallel to the surface of sample 202.

Probe 200 is not in contact with sample 202; instead, a constant separation between sample 202 and the base of probe 200 is automatically maintained by using a conventional electromechanical actuator or stage (not shown) controlled by an optical or capacitive distance-measuring sensor. For instance, the separation is between about 1 μm and 300 μm, or between about 25 μm and 100 μm.

In one embodiment, the detection coil is wound around an optical collimator and the optical fiber is coupled to the collimator. Use of a collimator reduces the dependence of the light intensity of the separation between the sample and the detection coil.

Referring again to FIG. 3, sample 202 is illuminated with light from light source 302, which is coupled to optical fiber 204 (not shown) in probe 200 and which generates light of a desired wavelength and intensity. The illumination light may be pulsed or continuous. The illuminated area of sample 202 is, for instance, 1 mm in diameter. In other embodiments, light from light source 302 is directed toward sample 202 by another type of light guide. Light source 302 is, for instance, a laser diode emitting light with a photon energy greater than the band gap energy of sample 202. The illumination light is thus capable of inducing production of electron-hole pairs in the sample.

Controller 304, which includes one or more computers 306 with programmable processors, controls the output of light source 302 and is coupled to light source 302 via a driver 308. A pulse generator 310 in controller 304 controls the intensity of the light emitted by light source 302 and the duration and repetition frequency of the illumination pulses, which may be rectangular pulses. Controller 304 also generally includes an analog-to-digital convertor (not shown) and a digital signal processor 366.

Sample 202 is also subjected to radio frequency (RF) electromagnetic radiation, preferably ultrahigh frequency (UHF) electromagnetic radiation. A frequency synthesizer 312, such as an oscillator, acts as an RF source and generates an RF signal 314, which passes through a power splitter 316. Frequency synthesizer 312 is controlled by controller 304. Power splitter 316 sends a first portion 314a of RF signal 314 to an RF bridge 318 and a second portion 314b through an amplifier 320 to a phase detector 322 (see below). Frequency synthesizer 312 may be, for instance, model PTS500 from Programmed Test Sources, Inc., Littleton, Mass., capable of providing a signal in a frequency range from 1 MHz to 500 MHz. RF bridge 318 is constructed around a 180-degree hybrid 324, which is a passive RF coupling device that includes four ports. An example of a suitable hybrid is model HC-W500-MS available from Universal Microwave Components Corporation (UMCC, Alexandria, Va.). When a signal is applied at a sum port (Σ port) 326 of hybrid 324, that signal is equally divided in phase and amplitude and appears at both a 0-degree port 328 and a 180-degree port 330. Any signal reflected from 0-degree port 328 appears in phase at a delta port (Δ port) 332; any signal reflected from 180-degree port 330 appears 180 degrees out of phase at Δ port 332.

Signal 314a provided by frequency synthesizer 312 is applied to Σ port 326 of hybrid 324. One-half of signal 314a is sent into a resonance branch 336 (see below); any power reflected from resonance branch 336 appears in phase at Δ port 332. The other half of signal 314a is sent through 0-degree port 328 to a reference branch 338. Reference branch 338 functions to balance RF bridge 318, as described below in conjunction with FIG. 4. In reference branch 338, the signal passes through a computer controlled variable attenuator 340 and then to a computer controlled line stretcher 342. Reference branch 338 ends in either an open circuit or a short circuit. If reference branch 338 ends in an open circuit, the signal is reflected with no phase shift; the signal returning to hybrid 324 then has a phase shift equal to twice the phase shift of line stretcher 342 and variable attenuator 340. If reference branch 338 ends in a short circuit, the signal is reflected with a phase shift of 180 degrees; the signal returning to hybrid 324 then has a phase shift equal to 180 degrees plus twice the phase shift of line stretcher 342 and variable attenuator 340. By adjusting the phase shift of line stretcher 342 and variable attenuator 340, the signal reflected from resonance branch 336 can thus be cancelled in hybrid 324.

Resonance branch 336 contains probe 200. In one embodiment, coaxial cable 207 of probe 200 is connected to 180-degree port 330 of hybrid 324 through an RF transformer 324, such as two transformers of model TC4-11, manufactured by Mini-Circuits, Brooklyn, N.Y., connected in series. This configuration ensures that the input impedance of hybrid 324, for instance 50 Ohms, is matched. In another embodiment, the diameter of detection coil 206 and the number of windings 208 are selected such that the input impedance of hybrid 324 is closely matched. In this case, coaxial cable 207 is connected directly to 180-degree port 330 of hybrid 324 without the need for a transformer.

The signal returning from resonance branch 336 exits hybrid 324 from Δ port 332 as a signal 346. Signal 346 passes through a first attenuator 348, a first amplifier 350, a low-pass filter 352, and reaches a power splitter 354. Power splitter 354 sends a first portion 346a of signal 346 to an RF power meter 356 and a second portion 346b of signal 346 through a second amplifier 358 and a second attenuator 360 to an RF phase detector 322. RF phase detector 322 demodulates signal 346a into two output DC signals 362a and 362b representing quadrature components of incoming signal 346a. Output signals 362a and 362b enter controller 304 and pass through low-pass filters 364a and 364b, respectively, which remove high frequency components from the signals. Signals 362a and 362b then pass through the analog-to-digital converter (not shown) and are processed by digital signal processor (DSP) 366 and computer 306. This process is performed multiple times, digitized, averaged, and, after subtraction of offsets, the results are combined to determine a magnitude of the signal. Use of the signal magnitude reduces the phase noise of the system and reduces the sensitivity to phase adjustment in reference branch 338 of RF bridge 318.

Figure 4:
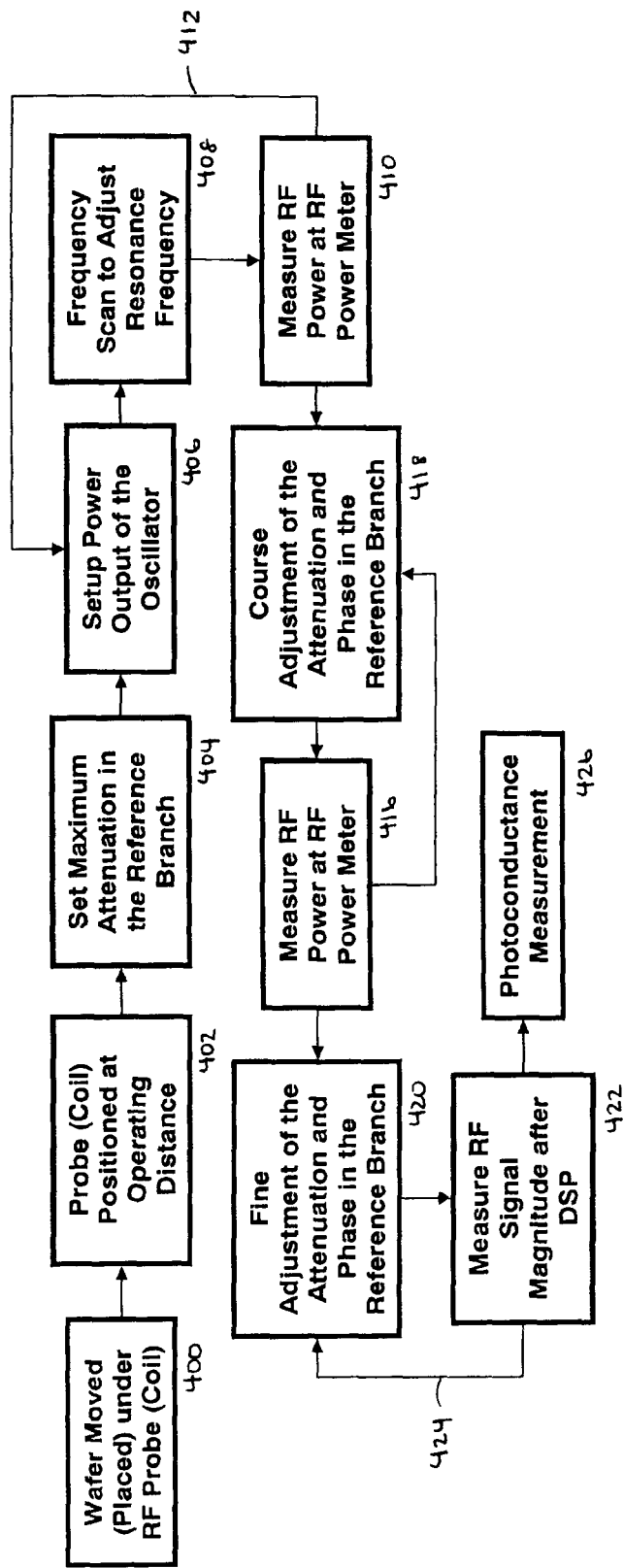
FIG. 4 is a flow diagram illustrating the procedure for initializing the semiconductor characterization system shown in FIG. 3.

Referring to FIG. 4, the process for initializing characterization system 300 is shown. To achieve maximum sensitivity, measurements are performed at or near the resonance frequency of the input LC circuit of probe 200. Adjustments of the operating RF frequency are performed for each sample. Sample 202 is placed under probe 200 (400) and probe 200 is positioned at a desired operating distance from sample 202 (402). Variable attenuator 340 in reference branch 338 is set to maximum attenuation (404). Frequency synthesizer 312 is set to low power output to prevent system overload (406), and the output frequency of frequency synthesizer 312 is scanned to adjust the resonance frequency of the input LC circuit (408). The signal 346a to RF power meter 356 is measured (410); the resonance frequency is found when the magnitude of signal 346a to RF power meter 356 is minimized. Steps 406, 408, and 410 are repeated (412), gradually increasing the output RF power of frequency synthesizer 312, until the RF power reaches its nominal power, which is predetermined in each measurement recipe. In one embodiment, the adjustment of the resonance frequency is computer controlled and performed by automatically scanning the output frequency of frequency synthesizer 312.

Figure 5:
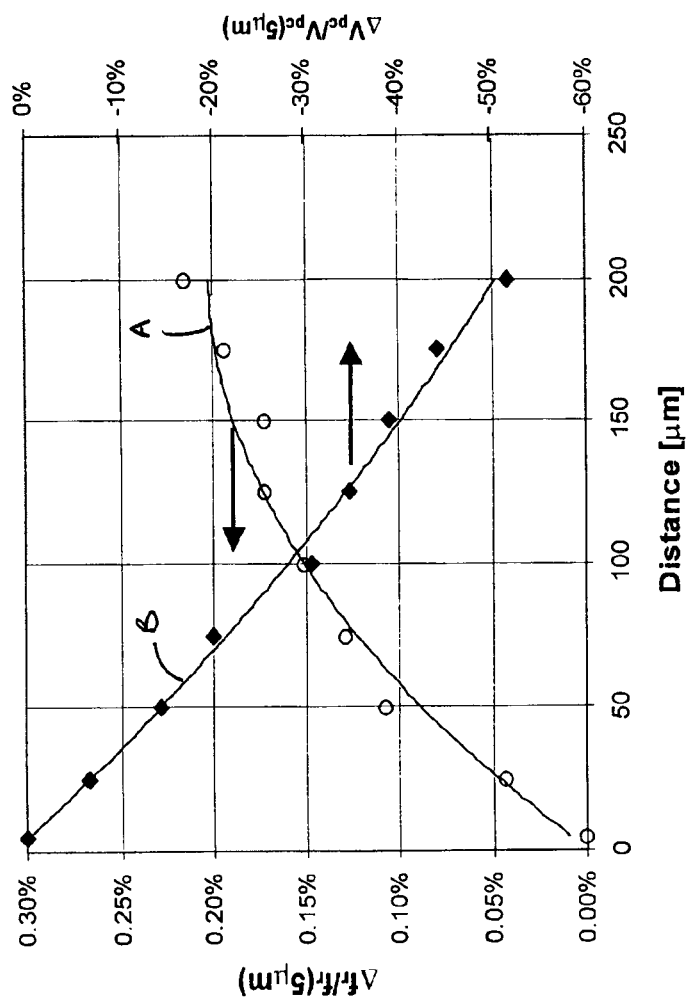
FIG. 5 is a graph showing the dependence of the resonance frequency and the photoconductance on the distance between probe and sample.

Referring to FIG. 5, the resonance frequency of the input LC circuit, shown by curve A, is only weakly dependent on the separation between sample 202 and probe 200. However, the photoconductance, shown by curve B, is much more sensitive to this distance. Thus, setting the operating distance is an important step in the measurement procedure. The change in the resonance frequency, $f_r$, is normalized to the resonance frequency at 5 μm separation (i.e., $\Delta f_r/f_r(5\,\mu m)=(f_r-f_r(5\,\mu m))/f_r(5\,\mu m)$). The change in photoconductance is normalized to the photoconductance at 5 μm separation (i.e., $\Delta V_{pc}/V_p(5\,\mu m)=(V_{pc}-V_p(5\,\mu m))/V_p(5\,\mu m)$).

Referring again to FIG. 4, once the resonance frequency is adjusted, RF bridge 318 is balanced, starting from a minimized signal to RF power meter 356, which provides a coarse null. The phase and magnitude of the signal are coarsely adjusted (414) by line stretcher 342 and variable attenuator 340, respectively, in reference branch 338 and the signal 346a at RF power meter 356 is measured (416) by DSP 366 and computer 306. The coarse adjustments are repeated (418) until a coarse minimum of signal 346a is achieved. Fine adjustments to the phase and attenuation are then performed (420) and the magnitude of the signal after DSP 366 is measured (422). The fine adjustments are repeated (424) until a fine minimum of the signal is achieved. In one embodiment, the coarse and fine minima of signal are defined as values within predefined multiples of the standard deviation of the noise limits of RF power meter 356 and DSP 366, respectively. This process allows the signal to be cancelled accurately, increasing sensitivity to small variations in the signal. In one embodiment, the adjustment of the magnitude and phase of reference branch 338 is computer controlled and performed automatically.

After RF bridge 318 is balanced, a photoconductance measurement is performed on sample 202 (426). A change in photoconductance in sample 202 affects the impedance between sample 202 and probe 200 and results in a loss of balance of RF bridge 318 and a corresponding change in signal 346 exiting Δ port 332. The resulting RF signal is submitted to RF phase detector 322, where it is split into output signals 362a and 362b. These output signals are filtered in controller 304 by low-pass filters 364a and 364b. The signal is repetitively measured a predetermined number of times. Each time, the signal is digitized for processing in DSP 366 and subject to averaging, subtraction of offsets, and analysis in computer 306.

Figure 6:
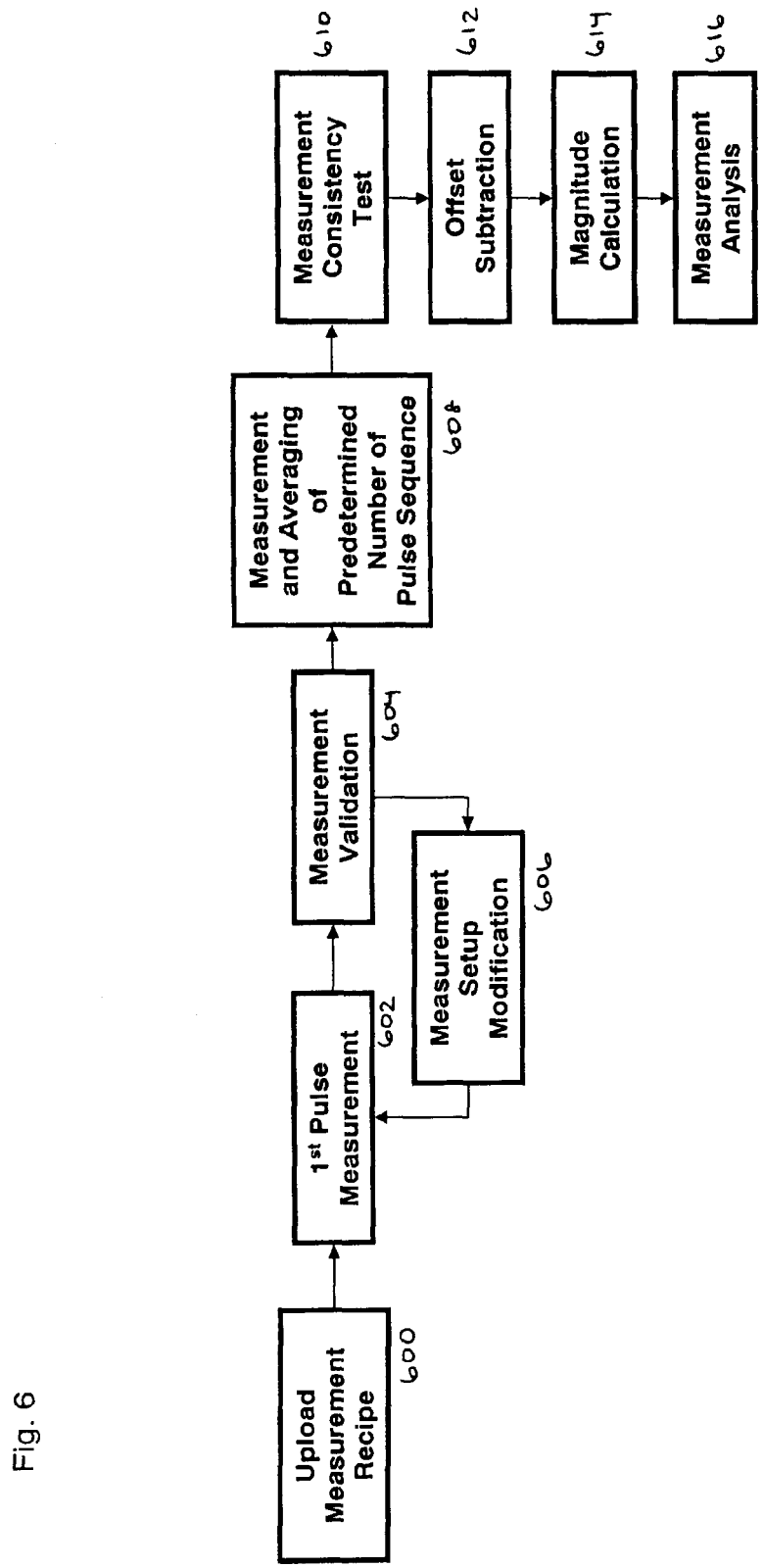
FIG. 6 is a flow diagram illustrating the procedure for performing a photoconductance measurement using the semiconductor characterization system shown in FIG. 3.

Referring to FIG. 6, the procedure for performing a photoconductance measurement is shown. Measurement is controlled by computer 306 in controller 304. A measurement recipe is uploaded into controller 304 (600); this is done either after RF bridge balancing or at the initiation of the measurement. The measurement recipe includes parameters such as the desired operating distance between sample 202 and the base of probe 200, a measurement pulse sequence, and the number of pulse sequences over which to average the measurement.

Figure 22A:
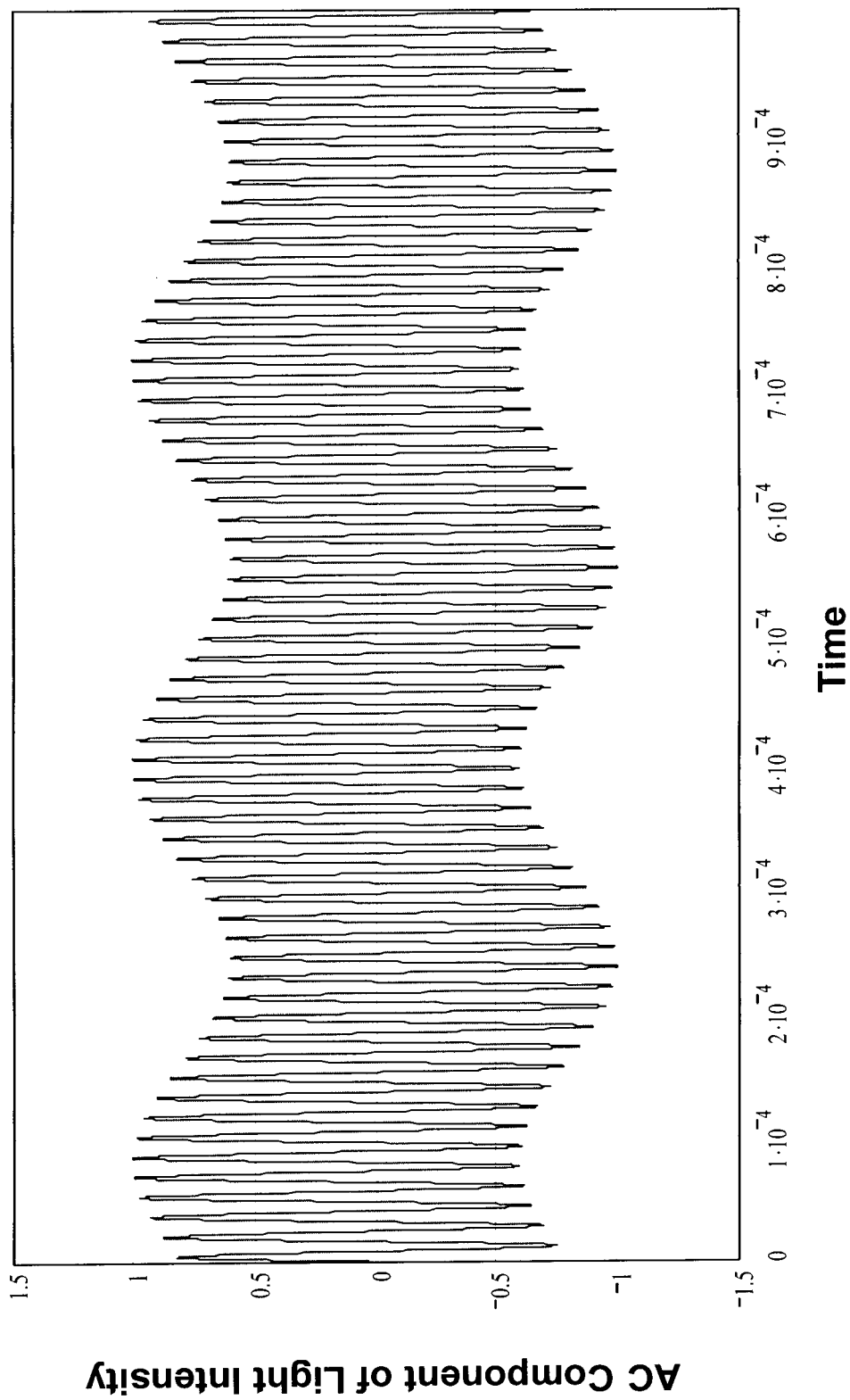
FIG. 22A is an illustration of the alternating current (AC) component of an intensity-modulated light with two superimposed frequencies.

Referring to FIG. 7A, an example of a measurement pulse sequence having a rectangular pulse is shown. A time period $t_1$ occurs prior to pulse initiation. The pulse itself has a width $t_p$. After the conclusion of the pulse, a time period $t_2$ occurs prior to initiation of the subsequent pulse sequence. In another embodiment, shown in FIG. 7B, the pulse sequence includes a continuous background illumination over which the small probing pulse is superimposed. In yet another embodiment, the pulse sequence is replaced by a continuous illumination to measure steady-state photoconductance. In yet still another embodiment, the pulse is replaced by continuous, sinusoidal, intensity modulated illumination that is superimposed over continuous background illumination, as shown in FIG. 22A.

Referring again to FIG. 6, the sample is illuminated with a first pulse sequence (602) and the measurement parameters are validated (604). To validate the measurement parameters, the signal during time period $t_1$ is compared with the signal at the end of time period $t_2$. In one embodiment, $t_2$ is equal to $t_1$, and the measurement is validated if both signals are statistically the same (i.e., the difference between signals is less than a predetermined number of standard deviations, as dictated by the measurement recipe). Validation ensures that a sufficient interval exists between illumination pulses to allow sample 202 to return to thermal equilibrium (dark) conditions prior to beginning the next pulse sequence. Not complying with the validation conditions may result in an apparent exponential decay of the photoconductance and thus in an incorrect determination of carrier lifetime. A second criterion for measurement validation involves determining that steady-state photoconductance is achieved during the illumination pulse. This is verified by checking that during a test period toward the end of the pulse, the signal is constant within a predetermined number of standard deviations. Validation is performed for each component of the signal reaching phase detector 322. If the validation is unacceptable, the pulse length (if steady-state photoconductance during the pulse is required) and/or the pulse frequency are modified (606) and the validation is repeated until correct. Validation may be performed either automatically or under user control, depending on the setup of the measurement recipe.

After validation of the measurement parameters, characterization system 300 performs measurement, filtering, and averaging of a predetermined number of pulse sequences for each component of the signal at phase detector 322 (608). The results of the averaging step are tested for consistency (610) using criteria similar to those of the measurement validation process, with appropriate standard deviation limits. Measurement offsets, determined by the magnitude of the signal during time period $t_1$, are subtracted from the results of the averaging process (612). The magnitude of the signal is calculated (614) and the results are analyzed (616). Use of the signal magnitude reduces phase noise of the system and reduces sensitivity to the phase adjustment performed in reference branch 338 and resonance branch 336. The signal analysis is performed by controller 304. In one embodiment, RF bridge is fine balanced before each measurement pulse sequence.

The procedure for obtaining photoconductance measurements using a probing illumination pulse that is superimposed over background illumination is similar to the aforementioned photoconductance measurement procedure that does not include background illumination. However, it should be noted that the use of background illumination additionally requires that after turning on background illumination, the sample reaches steady state using the remainder of the procedure as described above. The intensity of the background illumination and probing pulse are preferably computer controlled. The intensity of the background and probing illumination are set by analyzing probing pulse rise and decay transients and, in response thereto, decreasing probing pulse or rising background illumination until exponential rise and decays of photoconductance are reached. In the case of continuous, sinusoidally modulated probing illuminations, the intensity of the background and probing illumination is also preferably computer controlled. These intensities are set by analyzing dependence of the probing photoconductance signal on the probing light intensity and, in response, decreasing probing intensity or rising background illumination until a linear dependence between the probing photoconuctance signal and the intensity of the probing illumination is reached.

Semiconductor Characterization Methods

In the present invention, characterization of a semiconductor sample is achieved either (i) by analyzing the dependence of a steady-state photoconductance upon the intensity of an illumination light or (ii) by analyzing the time dependence of a photoconductance decay. For ease of explanation, the methods below are described with reference to semiconductor characterization system 300. However, it is to be understood that these methods are not limited to use only with characterization system 300; any system or apparatus that enables performance of the methods below may be used. Furthermore, the discussions and formulas herein are directed to an n-type semiconductor sample. However, the discussions and formulas could easily be converted to apply to a p-type semiconductor as well. The term 'photoconductance' is used herein to describe the sheet photoconductance of a sample. The unit for sheet photoconductance used in presenting formulas and measurement results herein is the Siemens (S).

The contribution of various types of imperfections to carrier recombination is extracted from either the steady-state photoconductance or the photoconductance decay. For instance, imperfections having different recombination characteristics or imperfections associated with different regions of a sample (e.g., a bulk of the sample or a surface of the sample) can be distinguished. The discussion herein divides imperfections into two classes based on their recombination characteristics: point imperfections and extended imperfections.

Point imperfections, or zero-dimensional (0-D) imperfections, include single-atom impurities, point defects in the crystal lattice of a sample, and small clusters including a few impurity atoms or lattice defect atoms. The photoconductance rise (i.e., the rise in photoconductance after commencing illumination of a sample) and photoconductance decay (i.e., the decay in photoconductance after terminating illumination of a sample) associated with point imperfections are characterized by an exponential dependence on time; the steady-state photoconductance exhibits a linear dependence on the intensity of the illumination or on the associated optical carrier generation rate. The photoconductance decay associated with point imperfections is given by $$\Delta \tau_{0\text{-}D}(\text{decay}) = \Delta \sigma_{0\text{-}D}(0) \exp(-t_d/\tau_{0\text{-}D}) \qquad (1)$$

where $\Delta\sigma_{0\text{-}D}(0)$ is the steady-state photoconductance or, more generally, the initial photoconductance at time $t_d=0$, immediately at the cessation of the illumination pulse; and $\tau_{0\text{-}D}$ is the effective minority carrier recombination lifetime due to recombination at point imperfections. The photoconductance rise associated with point imperfections is given by $$\Delta\sigma_{0-D}(\text{rise}) = \Delta\sigma_{0-D}(0)[1-\exp(-t_r/\tau_{0-D})] \quad (1')$$

where $\Delta\sigma_{0-D}(0)$ is the steady-state photoconductance or, more generally, the photoconductance reached after several (practically 3 to 5) time constants (carrier recombination lifetimes) after starting of the illumination pulse, symbolically marked here as $t_r=\infty$ (note that both photoconductance decay and rise are described by the same steady-state photoconductance $\Delta\sigma_{0-D}(0)$); and $\tau_{0-D}$ is the effective minority carrier recombination lifetime due to recombination at point imperfections, the same as for the photoconductance decay. If various types of point imperfection recombination centers are present in a sample, the effective recombination lifetime is a combination of the lifetimes associated with each type of point imperfection.

The steady-state photoconductance associated with point imperfections (specifically in the absence of carrier trapping effects typically associated with multi-dimensional imperfections when the density of excess electrons and holes is equal) is given by $$\Delta\sigma_{0-D}(0) = q(\mu_e+\mu_h)G_{0-D}\tau_{0-D} \quad (2)$$

where q is the magnitude of the elementary charge, $\mu_e$ and $\mu_h$ are the mobilities of the electron and the hole, respectively, and $G_{0-D}$ is the generation rate in the vicinity of a point imperfection.

Extended material imperfections, also known as multi-dimensional (M-D) imperfections, include, for example, one-dimensional (1-D) defects such as edge dislocations, two-dimensional (2-D) defects such as surfaces and grain boundaries, and three-dimensional (3-D) imperfections such as large (i.e., consisting of a large number of atoms) clusters of impurities or lattice defects. Under certain conditions, extended imperfections trap majority carriers (electrons for n-type semiconductors), thus becoming charged. The charge produces an electrostatic potential barrier $\Psi_d$ at the imperfection, limiting further capture of majority carriers. In some cases, such as at a surface, a charge arises due to built-in charge, such as a fixed oxide charge at an interface between silicon and silicon dioxide. Charged extended imperfections induce a Schottky-type depletion space charge region in the vicinity of the imperfection.

Figure 8A:
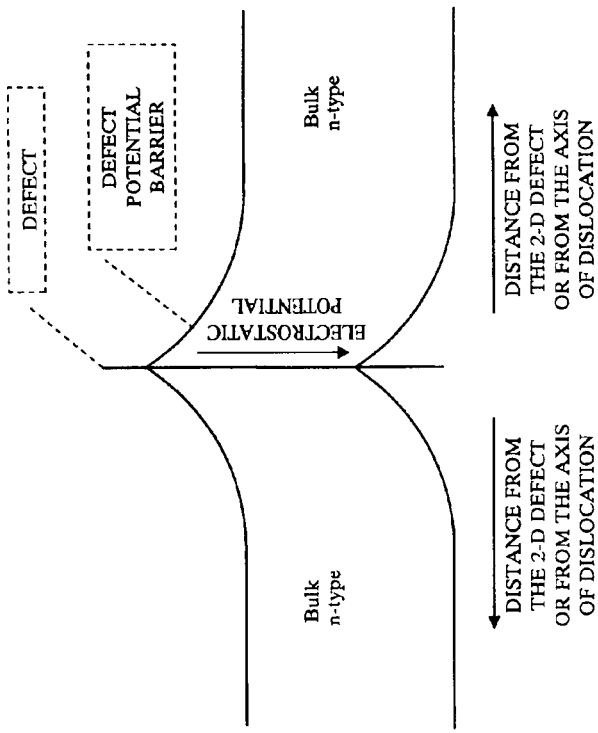
FIGS. 8A and 8B are schematic diagrams of the band structure for a semiconductor sample in the vicinity of a surface or an imperfection, respectively.
Figure 8B:
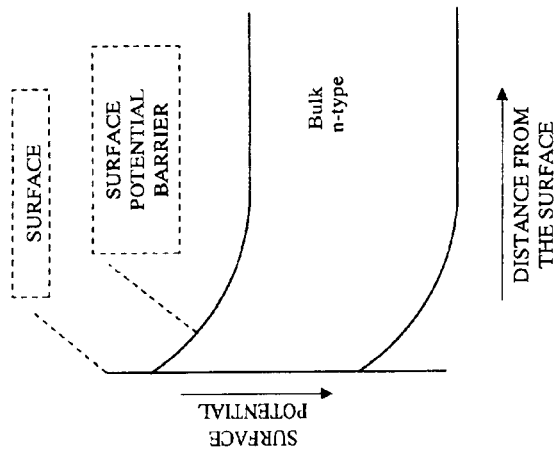

Referring to FIG. 8A, a band diagram illustrating the electrostatic potential barrier at the surface of an n-type semiconductor shows the electrostatic potential as a function of distance from the surface. Referring to FIG. 8B, a band diagram illustrating the electrostatic potential at a 2-D defect in the bulk of an n-type semiconductor shows the variation in the electrostatic potential in relation to the distance away from the defect. In the case of a grain boundary, the distance is measured perpendicular to the grain boundary. FIG. 8B can also represent the band diagram of a 1-D defect such as an edge dislocation; in this case, the electrostatic potential has cylindrical symmetry and the distance is a radial distance from the axis of the cylinder.

Figure 9:
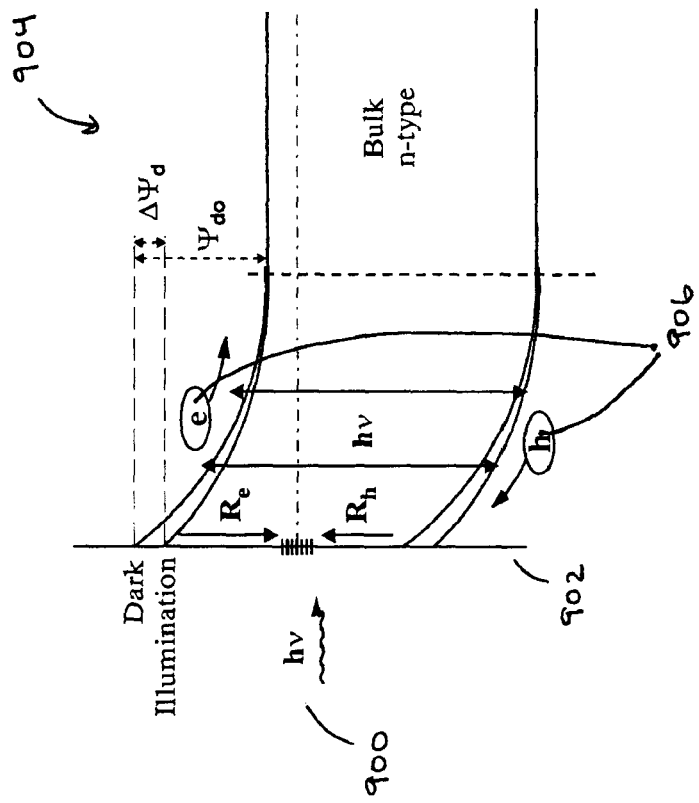
FIG. 9 is a schematic diagram of a band diagram of a semiconductor sample illuminated with a pulse of light.

Referring to FIG. 9, to perform a photoconductance measurement, an illumination pulse 900 is incident onto a surface 902 of a semiconductor sample 904. The illumination pulse generates electron-hole pairs 906 and leads to an increase in the density of free minority carriers (holes for n-type semiconductors) in the vicinity of imperfections. A strong electric field in the space charge region of an extended imperfection causes minority carriers photogenerated in the vicinity of the imperfection to be swept toward the imperfection, reducing height of the electrostatic potential barrier $\Psi_d$ and increasing the capture rate of majority carriers (electrons) at the imperfection. For sufficiently high carrier generation rates in the vicinity of the imperfection, the change in the potential barrier, $\Delta\Psi_d$, is much higher than the thermal energy kT, i.e., $$q\Delta\Psi_d > kT. \quad (3)$$

The control of the carrier capture rate by the height of the electrostatic potential barrier $\Psi_d$ leads to a logarithmic decay of the photoconductance associated with extended imperfections. If the carrier generation rate is not too high and thus does not substantially reduce the electrostatic potential barrier, most of the photogenerated minority carriers (holes) are captured by the imperfections and free electrons dominate the photoconductance. In this case, the photoconductance decay associated with extended imperfections is given by $$\Delta\sigma_{M-D}^H = kT\frac{\mu_e n_{t0}}{\Xi}\ln\left(\frac{t+\tau_o}{\tau_e}\right), \quad (4)$$

where time t begins at the cessation of the illumination pulse, $n_{t0}$ is the density of electrons trapped at the imperfection in thermal equilibrium (i.e., in dark conditions), and $\tau_0$ and $\tau_e$ are time constants. Time constant $\tau_0$ is given by the formula $$\tau_0 = -\frac{1}{G_{M-D}}\frac{n_{t0}}{q\Xi/kT} \quad (5)$$

and time constant $\tau_e$ is given by the formula $$\tau_e = -\frac{f_{t0}\exp(-q\Psi_{d0}/kT)}{c_e n_0 q\Xi/kT}, \quad (6)$$

where $f_{t0}$ is the probability that an imperfection state is occupied by an electron in thermal equilibrium, $\Psi_{d0}$ is the thermal equilibrium value of the electrostatic potential barrier, $c_e$ is the probability per unit time that an electron will be captured by an available imperfection site, and $n_0$ is the free electron concentration at thermal equilibrium.

For one-dimensional defects such as edge dislocations, the parameter $\Xi$ is given as $$\Xi_{1-D} = \Psi_{d0}; \quad (7)$$

for two-dimensional defects such as surfaces and grain boundaries, $\Xi$ is given by the formula $$\Xi_{2-D} = \frac{Q_{d0}n_{t0}}{\kappa\varepsilon_s N_D} \quad (8)$$

where $\kappa=1$ for the surface and $\kappa=4$ for the grain boundary, $Q_{d0}$ is the charge density at the defect at thermal equilibrium, $\varepsilon_s$ is the dielectric permittivity of the semiconductor material, and $N_D$ is the concentration of donors in the semiconductor. It should be noted that $\Psi_{d0}$ and $Q_{d0}$, and hence $\Xi$, are negative for n-type semiconductors; for p-type semiconductors these parameters are positive, but the polarity of Eqs. (4)-(6) is also reversed so that the resulting photoconductance and all time constants remain positive.

At high carrier generation rates, the steady-state photoconductance in the vicinity of extended imperfections is described by Eq. (4) for t=0, and can also be written as $$\Delta \sigma_{M-D}^H(0) = -kT \frac{\mu_e n_{t0}}{\Xi} \left[ \ln G_{M-D} - \frac{q\Psi_{d0}}{kT} - \ln(c_e n_0 N_t) \right], \quad (9)$$

displaying a logarithmic (i.e., non-linear) dependence on the intensity of the illumination pulse.

At a sufficiently low carrier generation rate in the vicinity of an imperfection, the change in the potential barrier, $\Delta \Psi_d$, becomes much lower than the thermal energy kT, i.e., $$q\Delta\Psi_d < kT, \quad (10)$$

and the photoconductance decay in the vicinity of an extended imperfection becomes an exponential process described by the formula $$\Delta \sigma_{M-D}^L = \Delta \sigma_{M-D}^L(0) \exp(-t/\tau_e), \quad (11)$$

where $\Delta \sigma_{M-D}^L(0)$ is the photoconductance at t=0. The time constant $\tau_e$ plays effectively the same role played by the minority carrier lifetime in the photoconductance decay for point imperfections.

Steady-state photoconductance in the vicinity of extended imperfections at low carrier generation rates is described by the formula $$\Delta \sigma_{M-D}^L(0) = q\mu_e G_{M-D} \tau_e. \quad (12)$$

This formula has the same form as the formula for steady-state photoconductance associated with recombination at point imperfections; however, instead of bipolar photoconductance, it considers only photoconductance associated with majority carriers.

Steady-state photoconductance associated with extended imperfections, given by Eqs. (9) and (12), considers only the contribution of electrons (majority carriers). Depending on measurement parameters, such as the wavelength of the illumination pulse and the material properties of the sample, the steady-state photoconductance could be distorted by the presence of excess free holes (minority carriers) not trapped in the space charge region of the imperfection. Similarly, the photoconductance decay, given by Eqs. (4) and (11), considers only the contribution of electrons. Depending on the measurement configuration, there could still be remnant holes outside of the imperfection space charge region at the first moment after the illumination pulse is stopped. However, these remnant holes would rapidly drift toward the space charge region and, a short time after the beginning of the relaxation, the decay process would be governed essentially by the rate of electron capture.

Example 1

Figure 10:
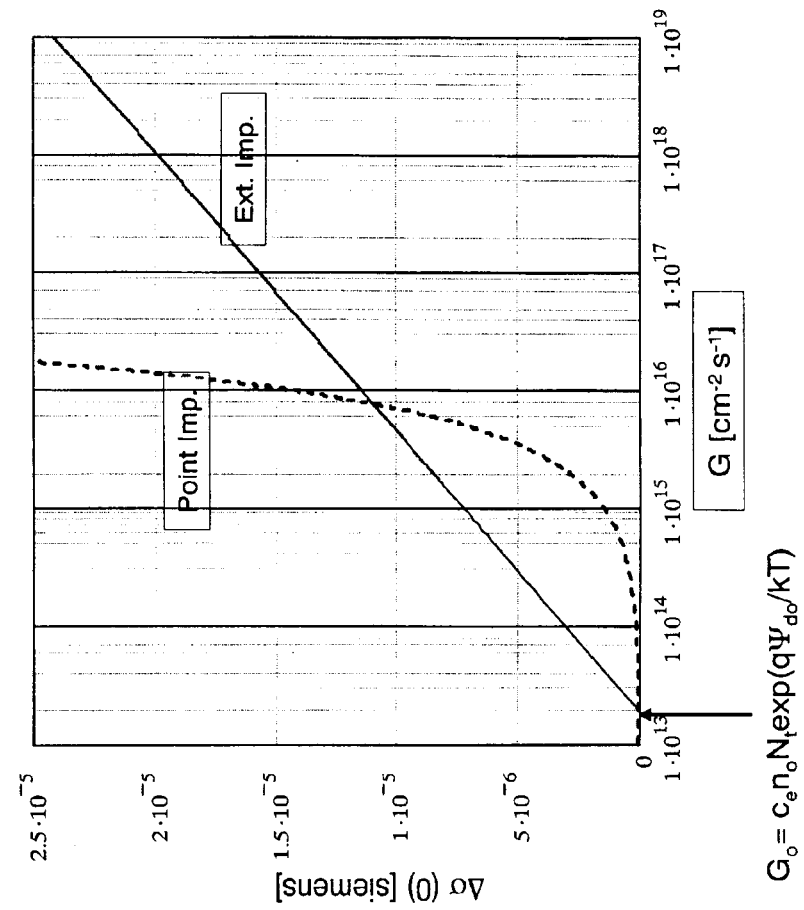
FIG. 10 is a graph showing the dependence of the steady-state photoconductance on the carrier generation rate (illumination intensity) for extended and point imperfections.

Referring to FIG. 10, the calculated dependence of the steady-state photoconductance on the carrier generation rate is shown for a sample having material parameters as follows: $n_o = 10^{15}$ cm$^{-3}$, $\Psi_{d0} = -0.4$ V, $Q_{d0} = -2 \times 10^{10}$ q/cm$^2$, $N_t = 1 \times 10^{11}$ cm$^{-2}$, $c_e = 9.65 \times 10^{-7}$ cm$^3$/s, $f_{t0} = 0.1$ and $\tau_b = 10$ µs. A logarithmic dependence of the photoconductance on illumination intensity is observed. At zero photoconductance (i.e., $\Delta \sigma_{M-D}(0) = 0$), the generation rate $G_0$ can be determined from Eq. (9):

$$G_0 = c_e n_0 N_t \exp(q\Psi_{d0}/kT). \quad (13)$$

The linear dependence shown for comparison represents light intensity dependence of the steady-state photoconductance associated with point imperfections. It demonstrates that linear photoconductance would dominate at high intensities while photoconductance associated with extended imperfections would dominate at low intensities.

Example 2

Figure 11:
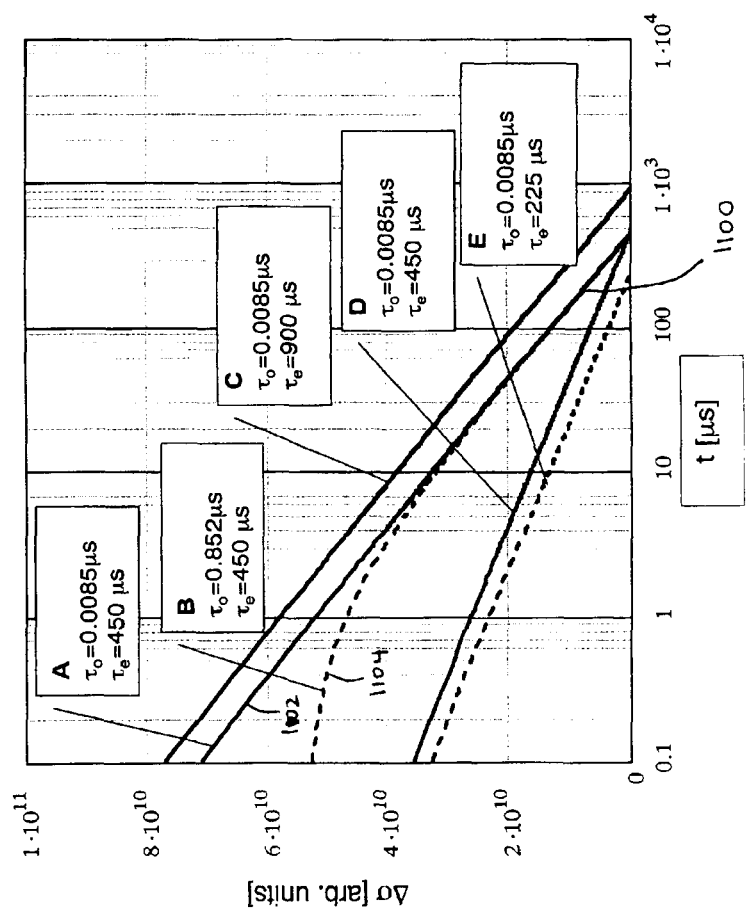
FIG. 11 is a graph showing the photoconductance decay for various sample parameters.

Referring to FIG. 11, the calculated photoconductance decay following a high intensity illumination pulse is shown in semi-log scale for five sets of sample parameters, given in Table 1. The five decay curves illustrate the effect of various material parameters on the photoconductance decay.

TABLE 1

|  | Curve A | Curve B | Curve C | Curve D | Curve E |
|---|---|---|---|---|---|
| G (cm$^{-2}$s$^{-1}$) | $10^{18}$ | $10^{16}$ | $10^{18}$ | $10^{18}$ | $10^{18}$ |
| $N_D$ (cm$^{-3}$) | $10^{15}$ | $10^{15}$ | $10^{15}$ | $5 \times 10^{14}$ | $10^{15}$ |
| $Q_{d0}$ (q/cm$^2$) | $-2 \times 10^{10}$ | $-2 \times 10^{10}$ | $-2 \times 10^{10}$ | $-2 \times 10^{10}$ | $-4 \times 10^{10}$ |
| $\Psi_{d0}$ (V) | $-0.4$ | $-0.4$ | $-0.4$ | $-0.4$ | $-0.4$ |
| $N_t$ (cm$^{-2}$) | $1 \times 10^{11}$ | $1 \times 10^{11}$ | $5 \times 10^{10}$ | $1 \times 10^{11}$ | $1 \times 10^{11}$ |
| $c_e$ (cm$^3$/s) | $9.65 \times 10^{-7}$ | $9.65 \times 10^{-7}$ | $9.65 \times 10^{-7}$ | $9.65 \times 10^{-7}$ | $9.65 \times 10^{-7}$ |
| $f_{t0}$ | 0.1 | 0.1 | 0.1 | 0.1 | 0.1 |

Curves A and B both have a logarithmic portion 1100 with the same slope which, for extended imperfections, is determined based on Equation (4) to be $$\varepsilon_s \mu_e kT \frac{N_D}{Q_{d0}}, \quad (14)$$

thus indicating that curves A and B correspond to samples having the same $N_D/Q_{d0}$ (doping concentration over defect charge density) ratio. Both curves are also characterized by the same time constant $\tau_e$ which, for two-dimensional defects such as surface, can be written following Equation (6) as $$\tau_e = -\frac{kT}{q} \frac{\varepsilon_s \exp(-q\Psi_{d0}/kT)}{c_e N_t Q_{d0}}, \quad (15)$$

indicating that the same electronic properties of the defects are responsible for carrier recombination. The only difference between curves A and B is the generation rate G. The difference in generation rate gives rise to different time constants $\tau_0$ which, for two-dimensional defects, can be written following Equation (5) as $$\tau_0 = -\frac{kT}{q} \frac{N_D}{Q_{d0}} \frac{\varepsilon_s}{G_{2-D}}. \quad (16)$$

Comparison of curves A and B shows that the initial decay of the photoconductance, shown in a region 1102 of curve A and a region 1104 of curve B, strongly depends through $\tau_0$ on the generation rate G. This initial portion of the decay is followed by the logarithmic region 700 described by Equation (4) and subsequently by an exponential decay (not shown) described by Equation (11).

Curves A and B demonstrate that, under high illumination conditions, the photoconductance decay does not follow the exponential decay pathway conventionally considered in photoconductance decay measurements. Furthermore, it shows that the slope of a decay curve does not necessarily characterize the decay. In particular, the initial slope of the decay (e.g., regions 1102 and 1104 of curves A and B) is determined by steady-state conditions and depends on the carrier generation rate. The recombination rate, or capture rate, is determined by the time at which a linear (in a semi-log plot) extension of the logarithmic portion of the decay crosses zero photoconductance.

Curves A and B were calculated using a density of defect traps, $N_t$, of $10^{11}$ cm$^{-2}$ and a probability of electron capture, $c_e$, of $9.65 \times 10^{-7}$ cm$^3$/s, the latter of which corresponds to a typical electron capture cross section for defect states present at an interface between silicon and silicon dioxide. To illustrate the effect of the electronic properties of two-dimensional defect states on the photoconductance decay, curve C was calculated using the same generation rate as curve A but with the density of defect traps reduced by a factor of two. The photoconductance decay is also affected by the defect charge density, $Q_{d0}$, and the doping concentration, $N_D$, in the region surrounding the imperfections. Curve D corresponds to a sample having the same generation rate as curve A but with the defect charge density increased by a factor of two; curve E has the doping concentration decreased by a factor of two.

The above-described dependence of the photoconductance on material properties can be used as a basis for materials characterization. In particular, in addition to or instead of considering exponential decay and linear dependence of the photoconductance on the illumination intensity (known as a linear or low-intensity approximation and corresponding to the low-excitation case discussed above), the non-linear photoconductance behavior characterized by non-exponential decay and non-linear dependence of the photoconductance on the illumination intensity is used to extract material properties from a photoconductance measurement. The following sections describe three embodiments demonstrating specific applications of the above method. The data analysis in the embodiments below may be performed automatically by controller 304 shown in FIG. 3.

Surface Characterization

In one embodiment, electronic properties of a surface of a semiconductor sample are characterized by photoconductance measurements of the sample. Before measurement, the sample is prepared for analysis by forming a depletion or inversion layer at the surface. Some samples may already possess a surface charge sufficient to induce a depletion or inversion layer due to previous processing; other samples are treated with a chemical treatment or by deposition of a corona charge. In silicon, chemical treatment with SC-1 or HF, depending on the sample type (i.e., n- or p-type), is conventionally used for such treatment. In one embodiment, surface preparation is performed before the sample is placed in the characterization system. Alternatively, the surface may be charged using corona discharge by the characterization system during measurement. In one embodiment, the corona charging conditions required for achieving surface inversion are established empirically by gradually depositing ionic corona charge and measuring either $\tau_e$ or the steady-state photoconductance; a stable value of $\tau_e$ or of the steady-state photoconductance indicates that inversion conditions have been established at the surface. Since $\tau_e$ depends exponentially on the height of the surface potential barrier, monitoring $\tau_e$ results in a more accurate determination of inversion than monitoring of the steady-state photoconductance.

The wavelength of the illumination pulse is selected to be sufficiently short so as to generate electron-hole pairs predominantly in the vicinity of the surface, so that all minority carriers are swept into the surface space charge region. For silicon, a diode laser emitting around 400 nm would provide sufficient illumination; however, even at longer wavelengths, such as 660 nm, the light absorption in the vicinity of the surface is sufficient to ensure dominance of the surface region. The intensity of the illumination and the length of the illumination pulse are selected to provide an excitation level (i.e., a total density of excess carriers) sufficient to change the surface potential barrier by an amount greater than the thermal energy (i.e., the situation of Eq. (3)) but low enough to ensure that the surface potential barrier remains substantially higher than the thermal energy. Since the photoconductance associated with the surface as an extended imperfection depends logarithmically on the intensity of illumination (see Eq. (9)) and the photoconductance associated with point imperfections in the bulk depends linearly on the illumination intensity (see Eq. (2)), reducing the carrier injection level (i.e., decreasing the illumination intensity) results in a decreased contribution of the bulk to the measured photoconductance (see FIG. 10).

Under such conditions, using Eqs. (4)-(6) and the expression for $\Xi_{2\text{-}D}$, the photoconductance decay can be expressed in a more explicit form given by the formula $$\Delta \sigma_S^H = \varepsilon_s kT \frac{\mu_e N_D}{Q_{d0}} \ln\left(\frac{t + \tau_0}{\tau_e}\right), \quad (17)$$

where $$\tau_0 = -\frac{kT}{q} \frac{1}{G} \frac{\varepsilon_s N_D}{Q_{d0}} \quad (18)$$

and $$\tau_e = -\frac{kT}{q} \frac{\varepsilon_s \exp(-q\Psi_{d0}/kT)}{c_e N_t Q_{d0}} \quad (19)$$

and where it is assumed that, at room temperature, $n_0 = N_D$.

The steady-state photoconductance described by Eq. (9) can be rewritten as $$\Delta \sigma_S^H(0) = -\varepsilon_s kT \frac{\mu_e N_D}{Q_{s0}} \left[ \ln G - \frac{q\Psi_{s0}}{kT} - \ln(c_e n_0 N_t) \right] \quad (20)$$

for the above conditions, where $Q_{s0}$ and $\Psi_{s0}$ are the surface charge and the height of the surface potential barrier, respectively, at thermal equilibrium.

The measurement conditions are pre-established empirically by verifying that the photoconductance decay includes a logarithmic decay segment. The length of the pulse is selected to achieve steady-state photoconductance during illumination. In other embodiments, the pulse length is shorter than the duration required to achieve steady-state conditions.

Figure 12:
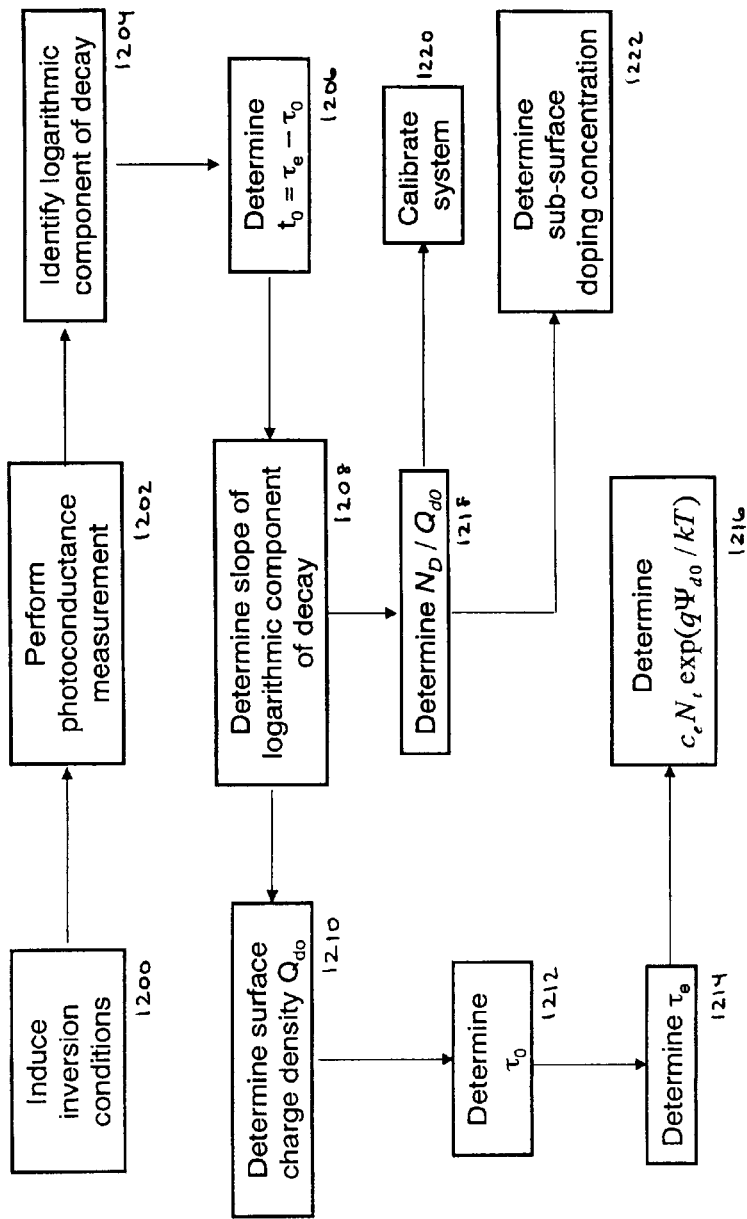
FIG. 12 is a flow diagram illustrating the procedure to determine parameters characterizing electronic properties of a surface of a semiconductor sample.

Referring to FIG. 12, the procedure to determine electronic properties characterizing a surface of a semiconductor sample is shown. Inversion conditions are induced (1200) and a photoconductance measurement is performed (1202) as described in FIG. 6. A logarithmic component of the photoconductance decay is identified (1204). By linearly extending the logarithmic component of the photoconductance decay to a value of zero photoconductance ($\Delta\sigma_{M\text{-}D}^{H}=0$), the value of $t_0=\tau_e-\tau_0$ is determined (1206). The slope of the logarithmic component of the photoconductance decay in a semi-log scale, i.e., $\Delta\sigma$ vs. log t, is calculated (1208) from Eq. (17) to be $$\frac{d}{d(\ln t)}(\Delta\sigma_S^H) = \varepsilon_s kT \frac{\mu_e N_D}{Q_{d0}}. \tag{21}$$

Using known material parameters, such as $\in_s$, $\mu_e$, and $N_D$ (for n-type semiconductors), the slope of the logarithmic component is used to determine the thermal equilibrium value of the surface charge density $Q_{d0}$ (1210). Alternatively, the surface charge density $Q_{d0}$ is determined from the slope of the dependence of the steady-state photoconductance on the generation rate (ln G in Eq. (20)). Using known material parameters, the independently determined carrier excitation rate G, and the surface charge density $Q_{d0}$ determined in step 1210, $\tau_0$ is determined from Eq. (17) (1212). From $\tau_0$ and $t_0$, $\tau_e$ is then determined (1214). For sufficiently high illumination intensities, $\tau_0$ becomes negligible and $t_0$ gives the value of $\tau_e$ directly. From these calculated parameters, the value of $c_e N_t \exp(q\Psi_{d0}/kT)$ can be determined (1216). Alternatively, $c_e N_t \exp(q\Psi_{d0}/kT)$ is calculated from the dependence of the steady-state photoconductance on the generation rate G. Following Eq. (20), a linear extension (in semi-log scale) of the logarithmic component of the photoconductance decay to the point at which this extension crosses zero photoconductance (see FIG. 10) gives $$c_e N_t \exp(q\Psi_{d0}/kT) = G_0/n_0. \tag{22}$$

The parameter $c_e N_t \exp(q\Psi_{d0}/kT)$ can be simplified by precharging the surface into inversion conditions using chemical treatment or corona charging. Since the value of $\Psi_{d0}$ under inversion is known, $c_e N_t$ can be directly determined.

System Calibration and Determination of the Subsurface Doping Concentration

The above procedure for surface characterization can be used for system calibration and determination of a subsurface doping concentration. Determination of the subsurface doping concentration using surface photovoltage methods is commonly used by silicon wafer manufacturers. This approach requires inversion conditions (a maximum depletion layer width) induced by chemical treatment or corona charging. Characterization of the surface, subsurface region and system calibration could be also performed taking advantage of the surface potential barrier formed due to pinning of the Fermi level by the surface states at fixed energy relative to conduction and valence band edges as disclosed in the U.S. Patent Application Publication No. 2011/0301892 to E. Kamieniecki, the disclosure of which is incorporated herein by reference. The photoconductance method presented herein enables this approach to be extended to thinner wafers and thin films. It also offers a more complete characterization of the sample, including determination of the bulk recombination lifetime, described below, in a rapid and non-destructive manner.

Referring again to FIG. 12, for system calibration or the determination of the subsurface doping concentration, inversion conditions are induced at the surface as described above, if necessary (1200). A photoconductance measurement is performed (1202) and a logarithmic component of the photoconductance decay is identified as described above (1204). The slope of the logarithmic component of the photoconductance decay in a semi-log scale is calculated (1208) as given in Eq. (21). After determination of the slope of the photoconductance decay, the ratio $N_D/Q_{d0}$ is determined (1218) from the formula $$\frac{N_D}{Q_{d0}} = -\sqrt{\frac{N_D}{4\varepsilon_s kT\ln(N_D/n_i)}}, \tag{23}$$

where $Q_{d0}$ is the surface charge density and $n_i$ is an intrinsic carrier density. Equation (23) applies to n-type semiconductors having surface inversion, the equation being modified accordingly if surface potential barrier is due to pinning of the Fermi level at the surface as disclosed in the U.S. Patent Application Publication No. 2011/0301892 to E. Kamieniecki); for p-type semiconductors, the polarity of the surface charge is positive and the right side of Equation (23) does not have a negative sign. Since the slope of the logarithmic component of the photoconductance decay depends only on basic material parameters and on the subsurface doping concentration (that is, doping within the surface space charge region), the slope can be used either to calibrate the system (1220), if doping concentration is known, or to determine the doping concentration for a previously calibrated system (1222).

Example 3

Figure 13:
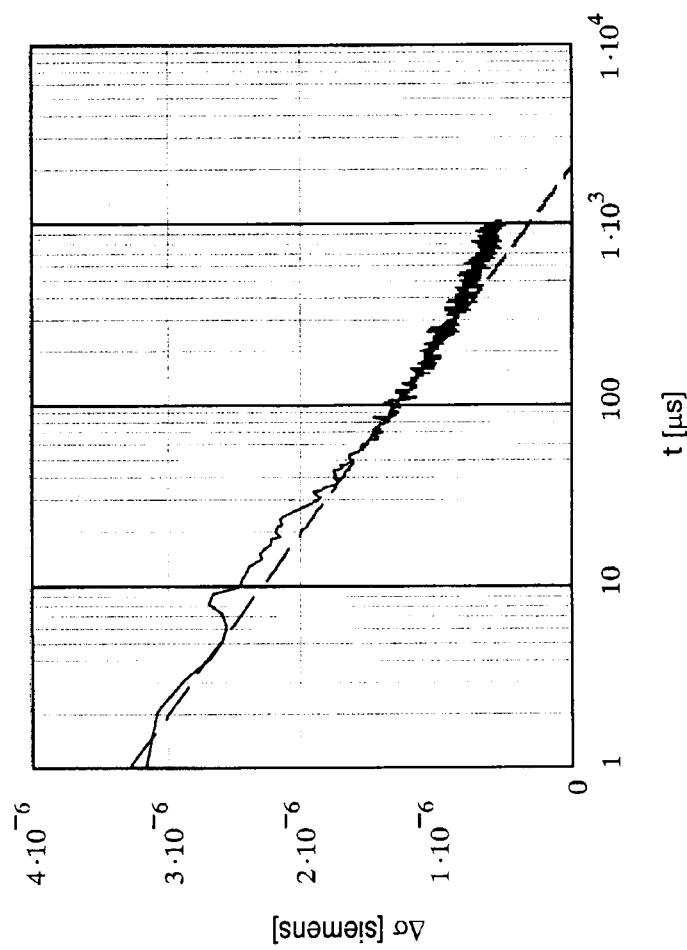
FIG. 13 is a graph showing a photoconductance decay curve used to calibrate a characterization system.

Referring to FIG. 13, a photoconductance decay curve for n-type silicon with a known doping concentration $N_D=1.06\times 10^{15}$ cm$^{-3}$ illuminated with light at a wavelength of 660 nm is shown. The doping concentration was determined with a four-point probe measurement. The slope of the curve was used to calibrate the characterization system according to Eq. (23).

Example 4

Figure 14:
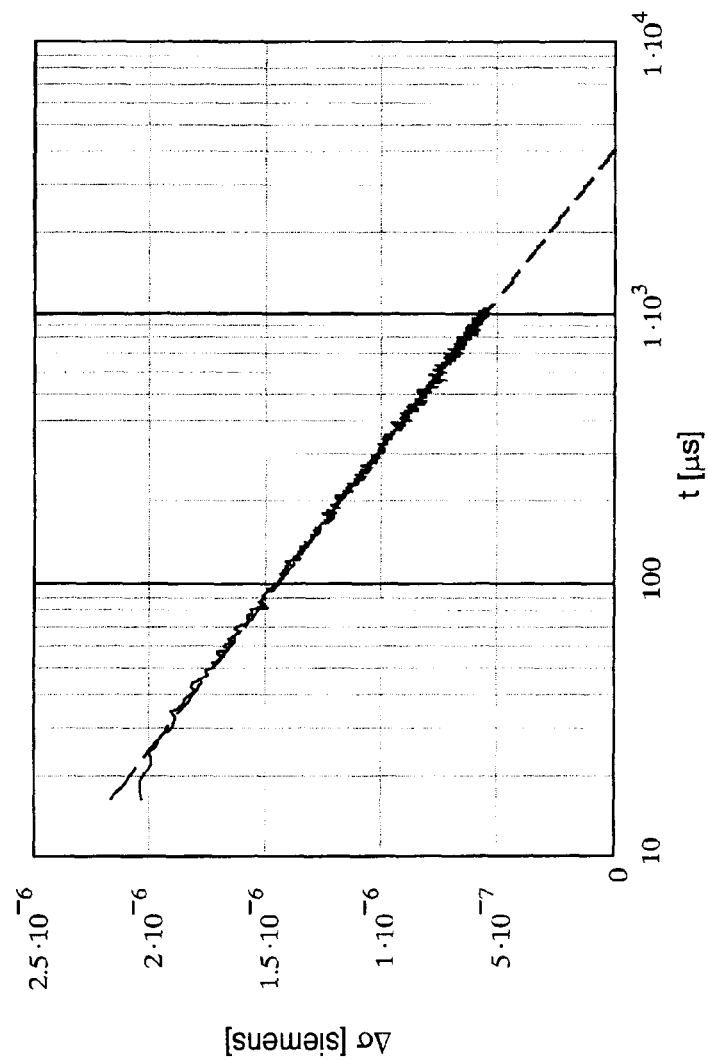
FIG. 14 is a graph showing a photoconductance decay curve used to determine a subsurface doping concentration.

Referring to FIG. 14, a photoconductance decay measurement of an n-type silicon sample with a resistivity of 5.5 $\Omega$-cm (as specified by the manufacturer) was performed using the characterization system calibrated as shown in FIG. 13. Prior to measurement, the sample was treated with an SC-1 cleaning solution to induce surface inversion. The subsurface doping concentration as determined from the slope of the logarithmic component of the photoconductance decay was $8.6\times10^{14}$ cm$^{-3}$ and $\tau_e$ was determined to be 3.9 ms, in excellent agreement with the manufacturer specifications.

Cleaning Process Monitoring

In one embodiment, the method for surface characterization described above is used to monitor surface cleaning and etching processes. This Defect-Specific Photoconductance (DSPC) technique is based on a non-linear RF-photoconductance measurement that monitors such processes.

Example 5

The density of surface traps (i.e., surface states) was calculated for the two samples depicted in FIGS. 13 and 14. Using $N_D$ and determining $\tau_e$ from Eq. (17) allows the determination of surface capture velocity, $c_e N_t$. Assuming that surface traps in the samples of both FIGS. 13 and 14 are characterized by the same $c_e$, the density of surface traps $N_t$ can be determined and thus the quality of the surface can be quantitatively characterized. The results are summarized in Table 2. The sample of FIG. 14 has a higher quality surface than the sample of FIG. 13, as indicated by the density of surface trans in each sample.

TABLE 2

|  | Sample of FIG. 13 | Sample of FIG. 14 |
| --- | --- | --- |
| Doping Concentration, $N_D$ [cm$^{-3}$] | $1.06 \times 10^{15}$ | $8.3 \times 10^{14}$ |
| Surface Charge Density, $Q_{s0}$ [q/cm$^2$] | $-9 \times 10^{10}$ | $-7.87 \times 10^{10}$ |
| Time Constant $\tau_e$ [ms] | 2.0 | 4.1 |
| $c_e \times N_t$ [cm/s] | $5.06 \times 10^6$ | $2.47 \times 10^6$ |
| $N_t$ [1/cm$^2$] (for $c_e = 9.65 \times 10^{-7}$ cm$^3$/s) | $5.24 \times 10^{12}$ | $2.56 \times 10^{12}$ |

Separation of Bulk and Surface Properties

In another embodiment, both bulk and surface properties of a semiconductor sample are characterized simultaneously without surface passivation.

The wavelength of the illumination pulse is selected to be sufficiently energetic so as to generate electron-hole pairs beyond the surface space charge region and into the bulk of the sample. The intensity of the illumination and the length of the illumination pulse are selected to provide an excitation level (i.e., a total density of excess carriers) sufficient to change the surface potential barrier by an amount greater than the thermal energy but low enough to ensure that the surface potential barrier remains substantially higher than the thermal energy. Since the photoconductance associated with the surface depends logarithmically on the intensity of illumination (see Eq. (9)) and the photoconductance associated with point imperfections in the bulk depends linearly on the illumination intensity (see Eq. (2)), adjustment of the carrier injection level (i.e., the illumination intensity) allows the bulk and surface contributions to the measured photoconductance to be balanced. Since surface effects dominate at low illumination intensities (see FIG. 10), increasing the measurement sensitivity by using a higher illumination intensity requires the selection of an illumination wavelength sufficiently short to assure strong surface photoconductance, so that the logarithmic decay associated with surface recombination is not overwhelmed by the bulk photoconductance.

The measurement conditions are pre-established empirically by verifying that the photoconductance decay includes a logarithmic component and an exponential component. The length of the pulse is selected to achieve steady-state photoconductance during illumination. In other embodiments, the pulse is shorter than the duration required to achieve steady-state photoconductance.

Under these conditions, the overall photoconductance is equal to the sum of the photoconductance associated with surface recombination (described by Eq. (17)) and that associated with the bulk. Assuming that bulk recombination is dominated by point imperfections (characterized by Eqs. (1) and (2)), the overall photoconductance is given as $$\Delta\sigma = \varepsilon_s kT \frac{\mu_e N_D}{Q_{d0}} \ln\left(\frac{t+\tau_o}{\tau_e}\right) + q(\mu_e + \mu_h) G_b \tau_b \exp(-t/\tau_b), \quad (24)$$

where $$\tau_0 = -\frac{kT}{q} \frac{1}{G_{sc}} \frac{\varepsilon_s N_D}{Q_{d0}} \quad (25)$$

and $$\tau_e = -\frac{kT}{q} \frac{\varepsilon_s \exp(-q\Psi_{d0}/kT)}{c_e N_t Q_{d0}}. \quad (26)$$

$G_{sc}$ is the generation rate in the surface region, $G_b$ is the generation in the bulk (both having units of 1/cm$^2$s), and $\tau_b$ is the effective recombination lifetime in the bulk. The overall generation rate is given by $$G = G_{sc} + G_b. \quad (27)$$

The ratio of $G_{sc}$ to $G_b$ depends on the wavelength of the illumination pulse and on material properties such as doping concentration, surface properties, and bulk diffusion properties. In one embodiment, surface and bulk effects are distinguished by illuminating the sample with two consecutive pulses, each having a different wavelength, and analyzing the subsequent photoconductance decay resulting from each pulse. Alternatively, more than one wavelength can be contained in a single illumination pulse.

Example 6

Figure 15:
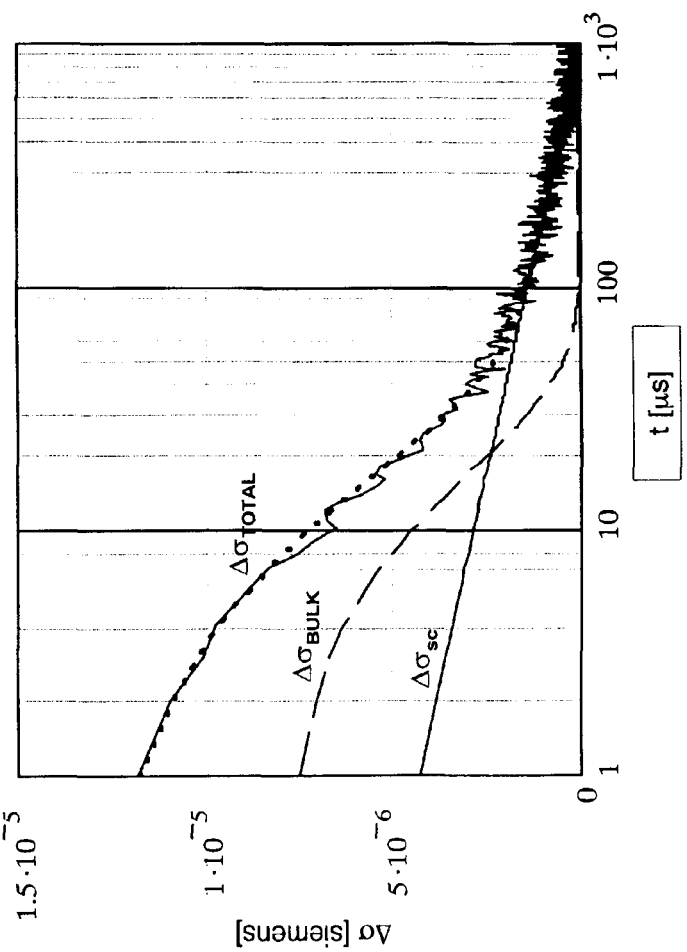
FIG. 15 is a graph illustrating a photoconductance decay curve.

Referring to FIG. 15, a photoconductance decay after a 660 nm illumination pulse under the above measurement conditions is shown for p-Si (~10 Ω-cm) after HF treatment. The solid line marked $\Delta\sigma_{TOTAL}$ shows the overall photoconductance decay; the line marked $\Delta\sigma_{sc}$ indicates the surface contribution to the photoconductance decay. In this case, the intensity of the illumination pulse was selected to be high enough to minimize the value of $\tau_0$ (see Eq. (16)) so that its effect on the photoconductance decay is negligible. In one embodiment, the intensity of the illumination pulse is selected by measuring the bulk lifetime $\tau_b$ for increasing illumination intensities until the bulk lifetime reaches a constant steady-state value. For example, for the sample illustrated in FIG. 15, the effect of $\tau_0$ on the photoconductance decay can be neglected above generation rates of about $5 \times 10^{17}$ cm$^{-2}$s$^{-1}$ for bulk lifetimes greater than about 1 μs.

Figure 16:
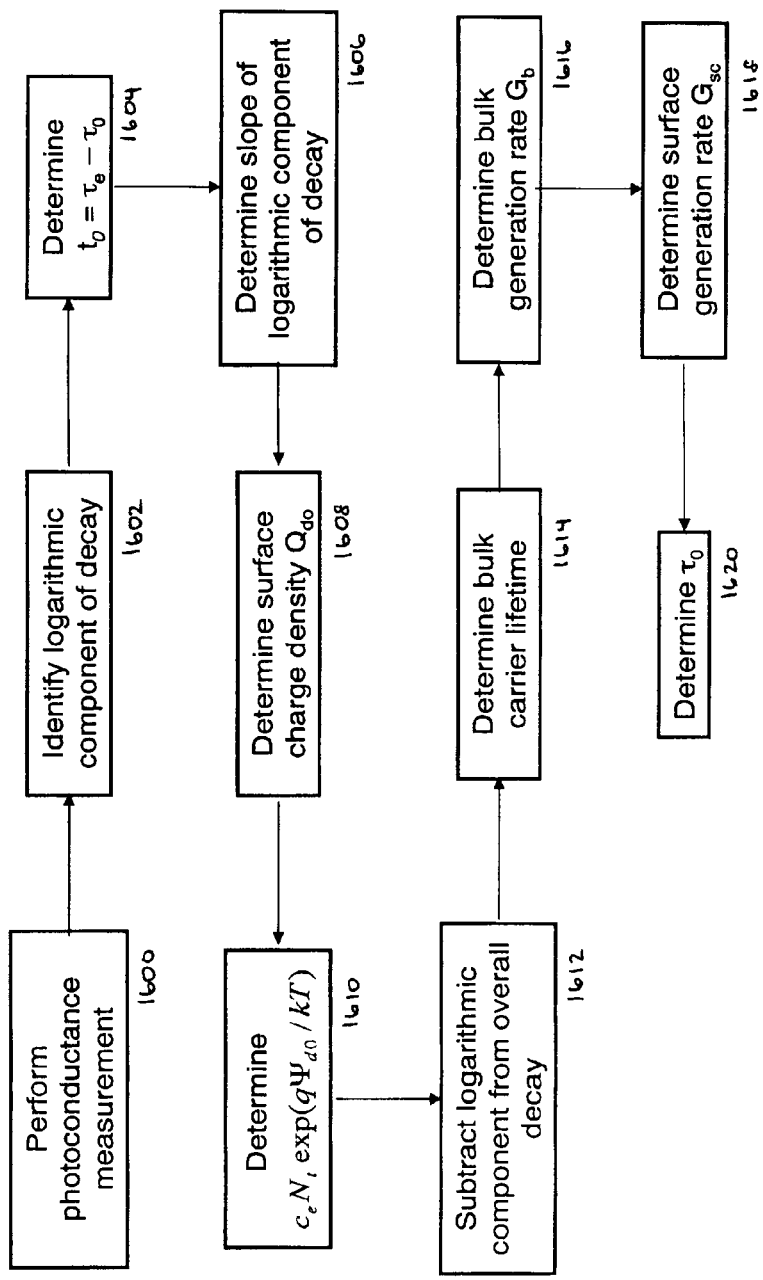
FIG. 16 is a flow diagram illustrating a procedure for determining parameters characterizing electronic properties of bulk and surface regions of a semiconductor sample.

Referring to FIG. 16, a procedure for determining parameters characterizing electronic properties of bulk and surface regions of a semiconductor sample is shown. After performing a photoconductance measurement as described in FIG. 4 (1600), the logarithmic component of the photoconductance decay is identified (1602). From the intersection of a linear (in a semi-log scale) extension of the logarithmic component with zero photoconductance, $t_0 = \tau_e - \tau_0$ is determined (1604). For sufficiently high illumination intensities, $\tau_0$ becomes negligible and $t_0$ gives the value of $\tau_e$ directly. The slope of the logarithmic component of the photoconductance decay in a semi-log scale, i.e., $\Delta\sigma$ vs. log t, is determined (1606) from Eq. (17) and is given in Eq. (21). Using known material parameters, such as $\Delta_s$, $\mu_e$, and $N_D$ (for n-type semiconductors), the slope is used to determine the thermal equilibrium value of the surface charge density $Q_{d0}$ (1608). From $Q_{d0}$ and $\tau_e$, the value of $c_e N_t \exp(q\Psi_{d0}/kT)$ can be determined (1610). The parameter $c_e N_t \exp(q\Psi_{d0}/kT)$ can be simplified by precharging the surface into inversion conditions using chemical treatment or corona charging. Since the value of $\Psi_0$ under inversion is known, $c_e N_t$ can be directly determined. Using known material parameters, $Q_{d0}$, and $\tau_e$, the logarithmic (surface) component of the photoconductance decay is numerically calculated and subtracted from the overall photoconductance decay (1612) to give the exponential (bulk) component of the photoconductance decay.

Figure 17:
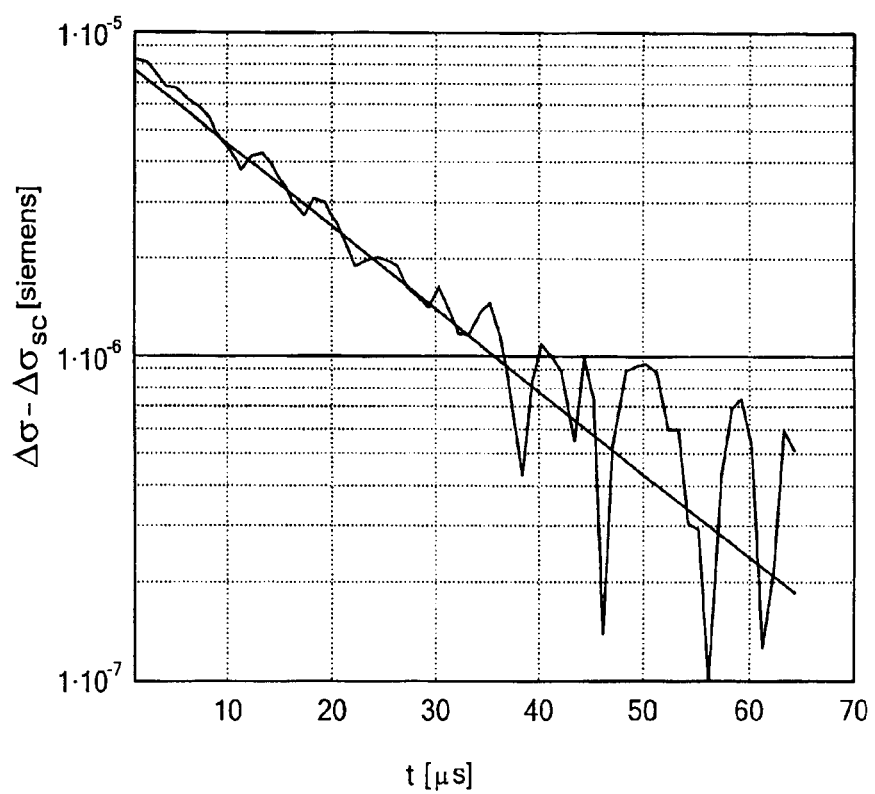
FIG. 17 is a graph showing the bulk component of a photoconductance decay.

Referring to FIG. 17, the bulk component of the photoconductance decay, obtained by subtracting the logarithmic component from the overall photoconductance decay ($\Delta\sigma_{BULK}=\Delta\sigma_{TOTAL}-\Delta\sigma_{sc}$) given in FIG. 15, is shown. The solid straight line illustrates calculated exponential decay for $G_b=3.2\times10^{15}$ cm$^{-2}$s$^{-1}$ and $\tau_b=17$ µs.

Referring again to FIG. 15, the result of the subtraction in step 1612 yields the exponential component of the photoconductance decay. From the slope of the exponential component, the effective minority carrier lifetime in the bulk is determined (1614). Using known carrier mobility, the magnitude of the exponential component is used to determine the bulk generation rate $G_b$ (1616). The surface generation rate $G_{sc}$ is then determined using Eq. (27), where the total generation rate G is determined independently using a calibrated photodetector (1618). Using $Q_{d0}$ and $G_{sc}$ determined in steps 1208 and 1218, respectively, and known material properties $N_D$ and $\in_s$, Eq. (16) is used to determine the value of $\tau_0$ (1620). As shown in FIG. 15, the dotted line represents the calculated total photoconductance as a sum of the surface ($\Delta\sigma_{sc}$) and bulk ($\Delta\sigma_{BULK}$) components calculated with $N_A=1\times10^{15}$ cm$^{-3}$, $G_{sc}=1\times10^{19}$ cm$^{-2}$s$^{-1}$, $G_b=3.2\times10^{15}$ cm$^{-2}$s$^{-1}$, $\tau_b=17$ µs, $Q_{d0}=2\times10^{10}$ q/cm$^2$ and $\tau_e=0.9$ ms.

Contribution of Point and Extended Imperfections

The photoconductance measurements described above are useful for the characterization of semiconductor samples and for the monitoring and identification of various types of material imperfections. The method is particularly suitable for characterization of multi-crystalline semiconductors. In solar grade multi-crystalline semiconductors such as silicon, the carrier lifetime is degraded due to both grain boundaries and chemical contaminants such as metals. These two sources of degradation are caused by different factors. The size of crystallites in the sample, which defines the density of centers associated with grain boundaries, depends to a large extent on parameters of the manufacturing process, whereas the concentration and type of contaminants depends on both processing and the purity of the starting material (e.g., polycrystalline silicon). Therefore, separating the contribution of these two types of imperfections is critical for photovoltaic manufacturing.

In one embodiment, the contribution to recombination properties and carrier lifetimes by point imperfections and extended imperfections can be distinguished. The procedure for distinguishing the contribution from each type of imperfection is closely related to the procedures described above. In this embodiment, the wavelength of the illumination pulse is selected to generate electron-hole pairs throughout the bulk of the sample. That is, the energy of the illumination pulse must be greater than the band gap of the semiconductor but sufficiently close to the main absorption edge of the sample so as to allow penetration of the light deep into the bulk of the sample. The intensity of the illumination and the length of the illumination pulse are selected to provide an excitation level (i.e., a total density of excess carriers) sufficient to change the surface potential barrier by an amount greater than the thermal energy but low enough to ensure that the surface potential barrier remains substantially higher than the thermal energy. Since the photoconductance associated with extended imperfections depends logarithmically on the intensity of illumination (see Eq. (9)) and the photoconductance associated with point imperfections depends linearly on the illumination intensity (see Eq. (2)), adjustment of the carrier injection level (i.e., the illumination intensity) allows contributions of point and extended imperfections to the measured photoconductance to be balanced.

The measurement conditions are pre-established empirically by verifying that the photoconductance decay includes a logarithmic component and an exponential component. The length of the pulse is selected to achieve steady-state photoconductance during illumination. In other embodiments, the pulse is shorter than the duration required to achieve steady-state photoconductance.

If necessary, the sample is prepared for analysis by passivation of a surface of the sample. Some samples may already be passivated due to previous processing. Passivation of silicon, for example, could be done by chemical treatment with SC-1 or HF depending on semiconductor conductivity type (p or n) or iodine passivation, which are conventionally used for such treatments. In one embodiment, surface preparation is done before the specimen is placed in the sample holder, e.g., by chemical treatment or by depositing a corona charge. Alternatively, the specimen may be charged by the semiconductor characterization system during measurement.

Once the surface is passivated, the procedure described in FIG. 16 is followed, with the surface terms replaced by terms representing grain boundaries of the sample. In this way, recombination parameters associated with grain boundaries (i.e., surface properties) and point imperfections (i.e., bulk properties) are determined. A ratio of $G_b$ to $G_{sc}$ gives the ratio of the volume of the sample where bulk point imperfections dominate to the volume where grain boundaries dominate the recombination properties. In another embodiment, the contribution of large 3-D clusters of impurities is distinguished from the contribution of point imperfections.

In this alternative embodiment, distinguishing contributions of the extended and point imperfections in the bulk to the recombination properties of semiconductor specimen is accomplished without surface passivation. In effect, this embodiment allows distinguishing contributions of both bulk point and bulk extended imperfections as well as the surface. Unlike the previous alternative, this embodiment requires the use of two series of pulses of different photon energy and different intensity. If two sources are used, their illumination could be combined into one optical fiber and delivered to the specimen through the fiber with the probe of FIG. 2.

Figure 18:
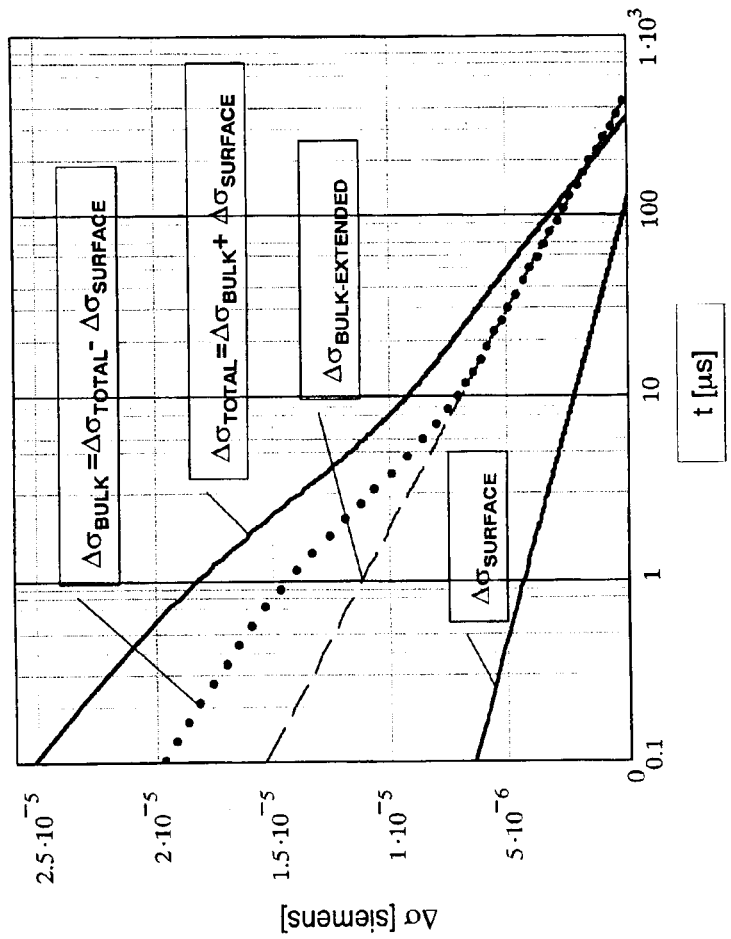
FIG. 18 is a graph illustrating simultaneous characterization of the bulk comprising point and extended imperfections and the surface.

In this embodiment, characterization of the electronic properties of the specimen combines two series of measurements performed using excitation pulses of different wavelength and intensity. Wavelength (such as 830 nm laser diode) of the excitation pulses in one series of measurements is selected to generate electron-hole pairs through an entire depth of the specimen, generating carriers both in the vicinity of the surface as well as in the bulk. In this case, carrier recombination occurs at the surface as well as at the extended and at the point imperfections in the bulk. The decay of the photoconductance following these pulses is illustrated in FIG. 18 with the line labeled $\Delta\sigma_{TOTAL}$ ($\Delta\sigma_{TOTAL}=\Delta\sigma_{BULK}+\Delta\sigma_{SURFACE}$) calculated using following parameters for the bulk photoconductance decay simulation: $N_D=10^{15}$ cm$^{-3}$, $Q_{do}=-2\times10^{10}$ q/cm$^2$, $N_t=10^{11}$ cm$^{-2}$, $G_b=10^{16}$ cm$^{-2}$s$^{-1}$, and $\tau_b=3$ µs; and for the surface: $Q_{do}=-4\times10^{10}$ q/cm$^2$ and $N_t=2\times10^{11}$ cm$^{-2}$. The other series of pulses uses shorter wavelength (such as 660 nm or 415 nm) to generate photoconductance decay associated predominantly with the surface recombination. The results of such measurements are illustrated in FIG. 18 with the line labeled $\Delta\sigma_{SURFACE}$. For $t>\Delta_0$ photoconductance decay associated with the extended bulk defects and with the surface is logarithmic and subtracting $\Delta\sigma_{SURFACE}$ data from $\Delta\sigma_{TOTAL}$ produces decay illustrated in FIG. 18 with dotted line labeled $\Delta\sigma_{BULK}$ ($\Delta\sigma_{BULK}=\Delta\sigma_{TOTAL}-\Delta\sigma_{SURFACE}$). The procedure for analysis of $\Delta\sigma_{BULK}$ and determining contributions of the extended and point imperfection in the bulk is closely related to the procedure disclosed in the previous section "Separation of the Bulk and Surface Properties." The data $\Delta\sigma_{SURFACE}$ are used to characterize recombination properties of the surface.

In another embodiment, different types of imperfections are distinguished by analyzing the dependence of the steady-state photoconductance on the intensity of the illumination light.

Other embodiments not explicitly described herein are also within the scope of the claims. For instance, if generation rates for a certain type of sample are not low enough to reveal the logarithmic component of the photoconductance decay or not high enough to suppress an initial deviation from logarithmic decay (that is, if $\tau_0$ is too high), measurement could be performed at two or more generation rates and time constants could be determined by numerical iteration. Additionally, electronic properties of a sample could be obtained by analyzing the time dependent rise in photoconductance when an illumination pulse first strikes the sample. The wavelength dependence of photoconductance also provides data for distinguishing between different types of imperfections in a sample. The methods described herein are of particular interest in solar cell manufacturing and, more generally, in any semiconductor manufacturing process utilizing thin films, such as large panel displays. Furthermore, these methods can be used for real-time in-line testing of semiconductor materials.

Determination of the Steady-State Carrier Recombination Lifetime in the Presence of Carrier Trapping As discussed above, under certain conditions, extended imperfections trap majority carriers. In some semiconductors, such as multi-crystalline silicon, the presence of (i) different types of extended defects, (ii) different size crystallites, and (iii) dislocations and clusters of crystallographic point defects and impurities can render analysis of the particular contribution of different types of defects on carrier recombination impractical. Furthermore, in the case of product wafers with a p-n junction, build-in electrostatic potential significantly affects carrier recombination, thereby distorting photoconductance transients and further complicating analysis of the contribution of different types of defects on carrier recombination.

The effects of carrier trapping are known to be diminished under strong continuous illumination due to a reduction in potential barriers at extended defects caused by the trapping of majority carriers. Similarly, strong illumination reduces electrostatic potential at the p-n junction which, in turn, diminishes its effect on carrier recombination. Since solar cells operate under continuous illumination corresponding to the steady-state conditions and effective carrier lifetime, it is preferable to monitor fabrication of the solar cells using steady-state carrier lifetime.

The steady-state carrier lifetime is conventionally determined by measuring steady state photoconductance and dividing it by carrier mobility and carrier generation rate (see Eqs. 2 and 12). Accordingly, the conventional steady-state (and quasi-steady-state) method is directly dependent on the accurate knowledge of the sample reflectivity, carrier mobility and light absorption characteristics. Since these semiconductor characteristics could change during photovoltaic cell processing (such as deposition of anti-reflecting coating or annealing), steady-state methods could lead to substantial mischaracterization of the photovoltaic cell fabrication processes.

In this embodiment, an alternative method for measuring steady-state carrier lifetime of a semiconductor sample exploits measurement of a rise and decay time of photoconductance induced by a small probing illumination pulse superimposed over much larger (approximately 10 times or more) background illumination. In an alternative approach, probing pulses are replaced by a continuous, intensity modulated, preferably sinusoidal, probing illumination that has an intensity that is much smaller than the background illumination, as will be described further in detail below.

Figure 19A:
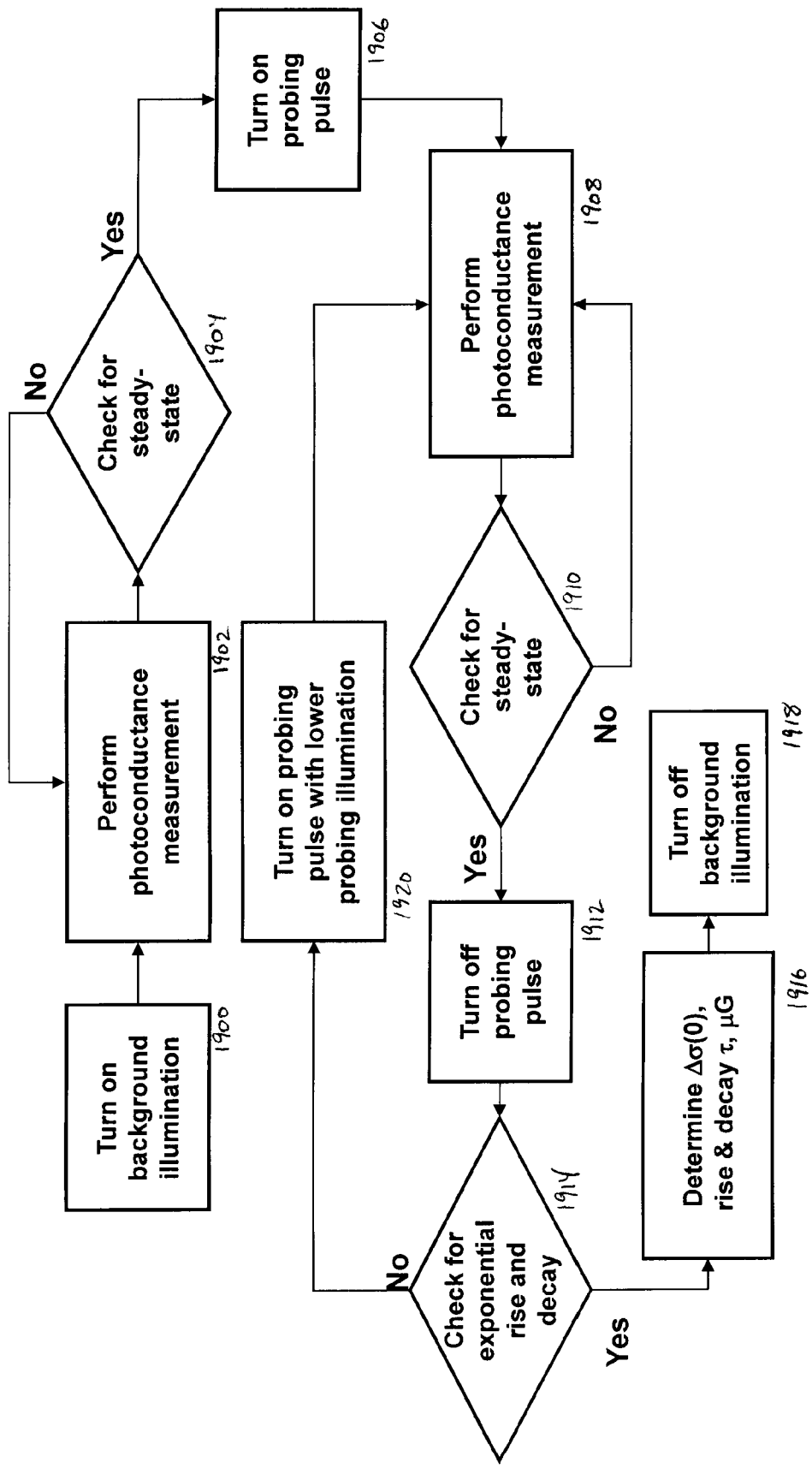
FIGS. 19A and 19B are flow diagrams illustrating various procedures for measuring steady-state recombination lifetime in a semiconductor sample.
Figure 19B:
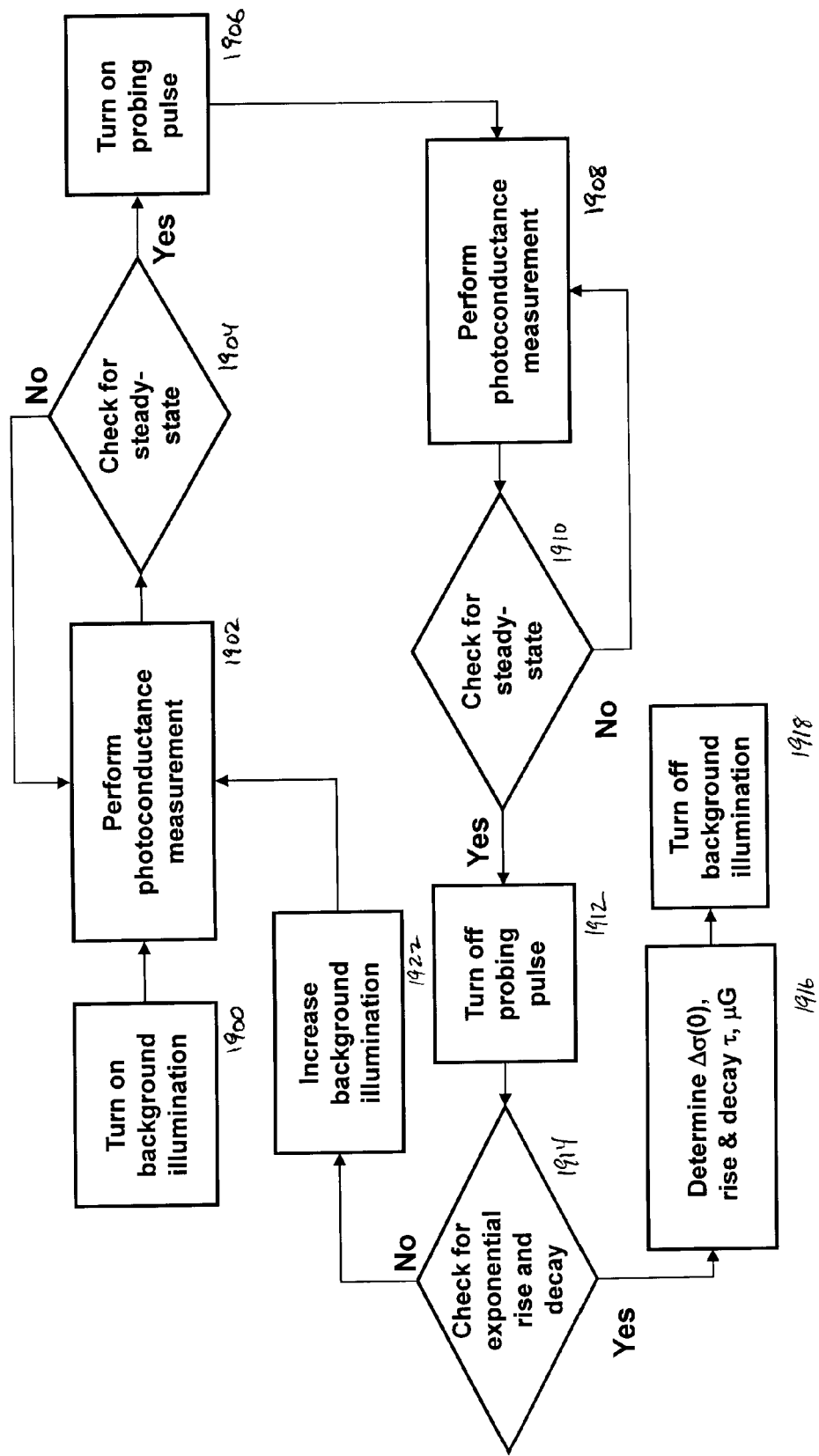

Referring to FIGS. 19A and 19B, two procedures are shown that utilize a small probing pulse to determine the steady-state carrier lifetime of a semiconductor sample. In both procedures, a surface of the semiconductor sample is first illuminated with a predetermined, background illumination for a duration sufficient to establish steady-state photoconductance in the semiconductor sample (1900). A photoconductance measurement of the semiconductor sample is then taken (1902) to determine whether a steady-state condition has been established (1904). If a steady-state condition has not been reached, the process returns back to the photoconductance measurement step (1902).

After reaching a steady-state condition, the sample is illuminated with an additional, low light intensity probing pulse (preferably a light pulse with an intensity that is approximately 10% or less of the intensity of the background illumination) that is superimposed over the background illumination (1906). The duration of the probing pulse is preferably set to be sufficient to achieve a new steady-state photoconductance in the sample. After it is determined that the new steady-state photoconductance has been reached (1910), the probing illumination is stopped (1912) and the probing photoconductance rise and decay are analyzed (1914). If the rise and decay of the probing photoconductance transient are exponential, material parameters are determined (1916) and the background illumination is eventually turned off (1918).

In the first variant of this method (see FIG. 19A), if the rise and decay of the probing photoconductance transient are not exponential, the sample is illuminated again with the probing pulse using a lower light intensity (1920). The probing pulse intensity is gradually decreased until the rise and decay of the probing photoconductance transient become exponential. Since the carrier recombination time constant of an extended defect using a low probing pulse intensity is described by an exponential function (see Eq. 11) similar to that of point defects (see Eq. 1), the time constant measured with the above-identified procedure represents the effective steady-state carrier recombination lifetime due to all recombination centers associated with both point and extended defects under the background illumination.

In the second variant (see FIG. 19B) of this method, if the rise and decay of the probing photoconductance transient are not exponential, the intensity of the background illumination is increased (1922) and the process returns to the initial photoconductance measurement step (1902). The background intensity is gradually increased until the photoconductance decay and rise are described by exponential functions, as described in Eqs. 1 or 2 and 1'.

Since the intensity of the probing pulse illumination (as well as the corresponding photoconductance) in both the first and second variants of the aforementioned method is much less than the intensity of the background illumination (as well as the corresponding photoconductance), the probing pulse only presents a small disturbance to the steady-state conditions, with measured wafer characteristics correspondings to the steady-state conditions and measured steady-state carrier lifetime representing total carrier lifetime due to all recombination centers in the steady state conditions under background illumination.

Figure 20B:
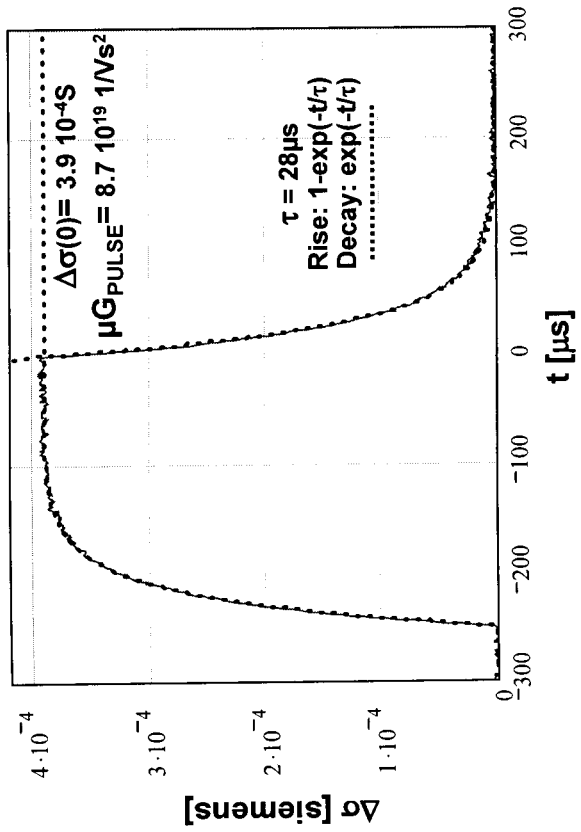
FIGS. 20A and 20B are graphs illustrating transient photoconductance measured without and with background illumination, respectively, the transient photoconductance being measured on a partially processed photovoltaic wafer.
Figure 20A:
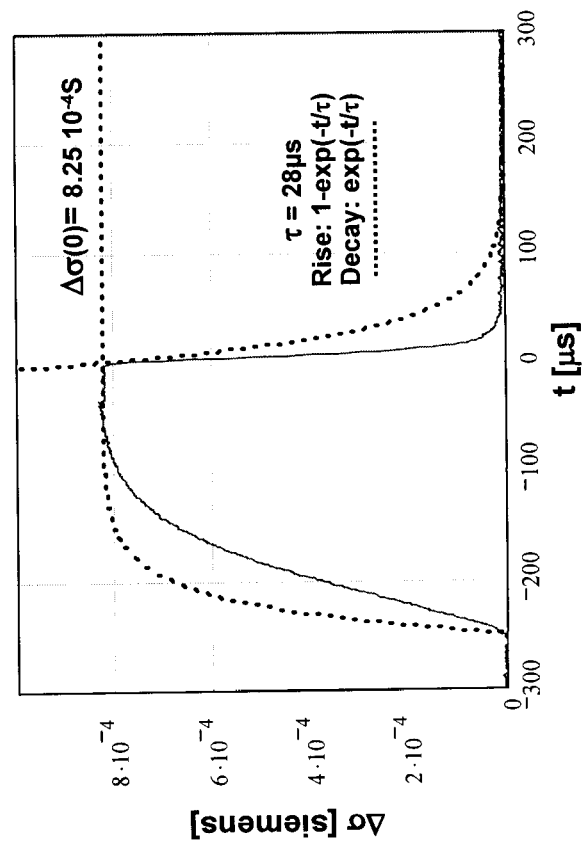

The effects of the above procedure (FIG. 19B) are illustrated in actual measurements taken in FIGS. 20(A) and 20(B) using a photovoltaic mc-Si (multi-crystalline silicon) wafer structure with a diffused p-n junction, anti-reflecting coating and back metal. As can be seen, the introduction of background illumination, as shown in FIG. 20B, neutralizes the effect of p-n junction and extended defects producing exponential rise and decay transients, thereby enabling the actual, or measured, value (represented in line form) to more accurately reflect the ideal, or calculated, value (represented in dotted form). The measured steady-state lifetime characterizes substantially carrier recombination in the bulk of the wafer ("base"), more particularly, in the region between the front p-n junction and the back metal contact.

The analysis of the probing photoconductance induced by a small probing illumination pulse also allows for the determination of the change of the effective steady-state photoconductance associated with the probing pulse, $\Delta\sigma_{pp}(0)$, and determination of the effective generation rate (multiplied by the carrier mobility) of carriers in the bulk of the semiconductor sample using Eqs. (2) or (12)

$$\mu G_{pp} = \Delta\sigma_{pp}(0)/qt_{steady-state} \quad (28)$$

where subscripts "pp" refer to the parameters measured with the probing illumination pulse and $\mu$ is an effective carrier mobility Comparison of the effective generation rate (multiplied by the carrier mobility) with the incident photon flux allows for establishing effective surface reflectivity (multiplied by the carrier mobility). The results for 3 points of the mc-Si wafer structure utilized in FIGS. 20A and 20B and measured using the same background and probing pulse illuminations are summarized in Table 3. The results show that uniformity of the optical properties and carrier mobility was much better than material uniformity.

TABLE 3

| Point | τ [μs] | $\mu G_{pp}$ [V$^{-1}$s$^{-2}$] |
|---|---|---|
| A | 28 | 8.69 × 10$^{19}$ |
| B | 38 | 8.21 × 10$^{19}$ |
| C | 36 | 8.76 × 10$^{19}$ |
| Uniformity | 29% | 6% |

FIGS. 21A and 21B show actual measurement results achieved using the method set forth in detail above and represented in FIG. 19B at two consecutive processing steps during the fabrication of the mc-Si photovoltaic cell. These results indicate that a baking step in the fabrication process increased the steady-state recombination lifetime about 5 times. At the same time, it should be noted that $\mu G_{pp}$ remained constant within the measurement error. This coincides with much better uniformity of the $\mu G_{pp}$ as compared to uniformity of the carrier lifetime as shown in Table 3. These results indicate that the baking process did not affect a change in the reflectivity of the anti-reflective coating (AR) while, at the same time, substantially improving the quality of the material.

A possible modification to the methods shown in FIGS. 19A and 19B involves replacing the probing pulses of each method with a continuously periodically intensity modulated probing illumination that is superimposed over background illumination. For rectangular light intensity modulation, this pulse modification corresponds to $t_p = t_1 + t_2$ in FIG. 7. However, in this variant of the methods, the probing light is preferably modulated sinusoidally. In the case of photovoltaic solar cell applications, the background illumination intensity is preferably 100 mW/cm$^2$ (or 1 kW/m$^2$, one-sun of illumination). The ac-photoconductance signal is collected after a period sufficient to establish dynamic equilibrium conditions.

The probing light intensity, which is preferably 10% or less of the intensity of background illumination, is adjusted to the level at which the ac-photoconductance signal is linearly dependent on the probing light intensity. The ac-photoconductance signal is then analyzed using digital signal processor (22)-based phase sensitive detection (lock-in). This approach allows measurements to be taken of both the amplitude and phase of the ac-photoconductance signal. Typically, the phase sensitive detector (lock-in) outputs the real (in-phase) and imaginary (quadrature) components of the signal. These components could be measured at the same frequency or at different frequencies. In the case of sinusoidal modulation, the ac component of the generation rate is derived from the equation $$\delta G = G_a(\omega)\exp(j\omega t) \quad (29)$$

where $G_a(\omega)$ is the frequency dependent amplitude of the intensity modulated light-induced carrier generation rate, $\omega$ is the angular frequency of light modulation, and t is time. At low probing intensities, the real and imaginary components of ac-photoconductance could be written in the form $$\mathrm{Re}(\delta\sigma)_{LF} = q\mu \frac{G_a(\omega_{LF})}{\omega_{LF}} \frac{\omega_{LF}\tau}{1+\omega_{LF}^2\tau^2} \quad (30)$$

and $$\mathrm{Im}(\delta\sigma)_{HF} = -q\mu \frac{G_a(\omega_{HF})}{\omega_{HF}} \frac{\omega_{HF}^2\tau^2}{1+\omega_{HF}^2\tau^2} \quad (31)$$

where the high frequency (HF) is preferably less than 200 kHz and the low frequency (LF) is preferably less than 1 kHz. Specifically, in the preferred embodiment, high frequency is about 3.5 kHz and low frequency is about 200 Hz. In the case of a single frequency measurement $\omega$, with $\omega_{LF} = \omega_{HF}$, the time constant is derived from the equation $$\tau = -\frac{1}{\omega}\frac{\mathrm{Im}(\delta\sigma)}{\mathrm{Re}(\delta\sigma)} \quad (32)$$

Figure 22B:
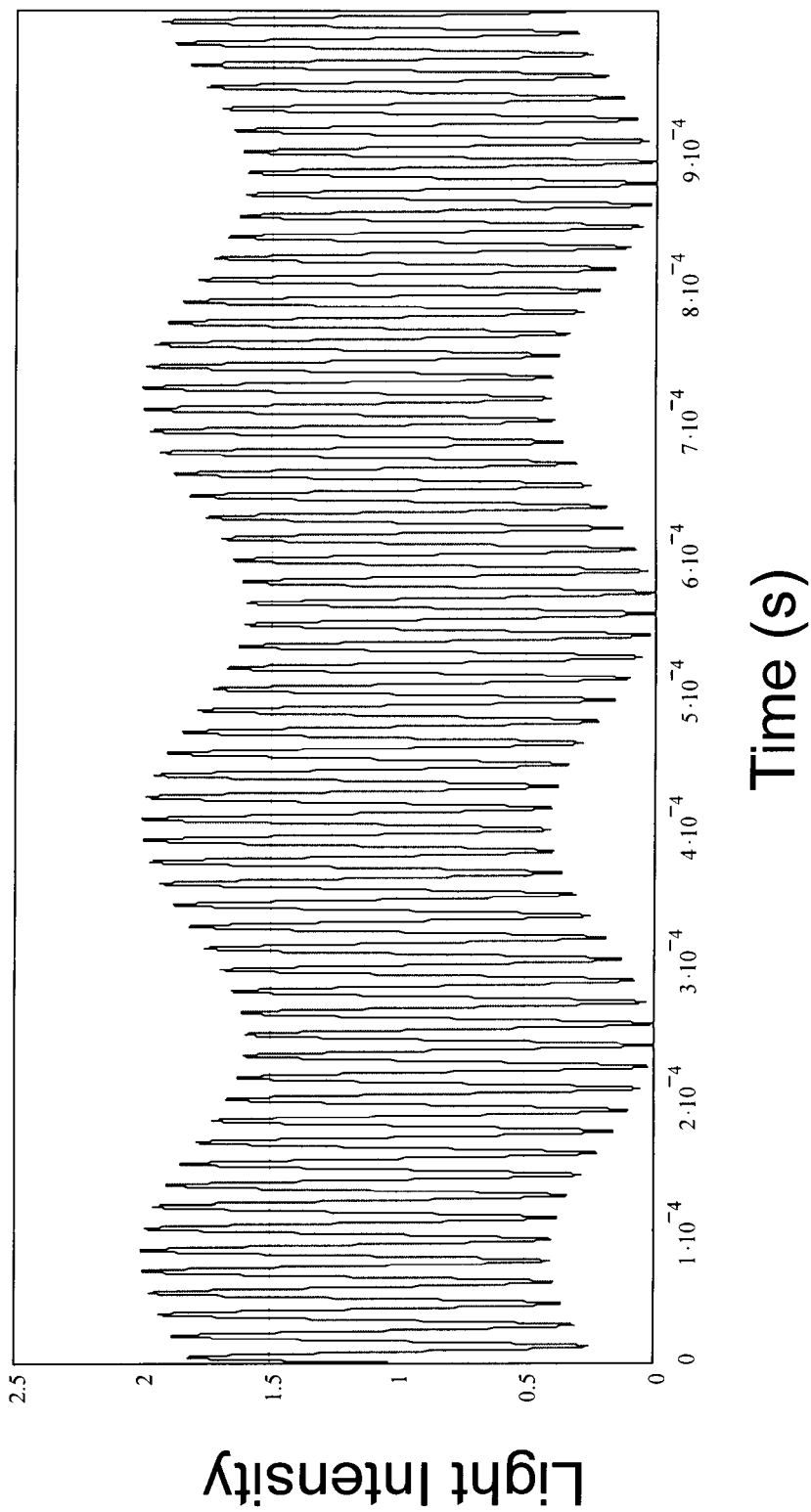
FIG. 22B is an illustration of the alternating current (AC) component of an intensity-modulated light with two superimposed frequencies shown in FIG. 22A, the illustration being show with the lowest possible direct current (DC) components.

However, when measuring both components of ac-photoconductance using a single frequency, accurate determination of the time constant $\tau$ could be limited by phase noise introduced from photoconductance measurements. Particularly in the case of a long carrier recombination lifetime, the measured lifetime is strongly affected by measurement noise of $\mathrm{Re}(\delta\sigma)$. Relatively small values associated with $\mathrm{Re}(\delta\sigma)$ (i.e., values much smaller than $\mathrm{Im}(\delta\sigma)$) are highly susceptible to measurement noise and therefore result in unreliable carrier lifetime measurements. Therefore, it is beneficial to measure the real and imaginary components of the ac-photoconductance at different frequencies to maximize magnitude and signal-to-noise ratio of each component of the ac-photoconductance. Instead of performing measurements serially, the measurement could be performed simultaneously at multiple frequencies with light sources modulated at dual, superimposed, frequencies as illustrated in FIGS. 22A and 22B. In this case, the phase sensitive detection would separate real and imaginary components of the signals according to each frequency. To optimize the signal-to-noise ratio of each component, the high frequency is preferably selected such that $\omega_{HF}^2\tau^2 \gg 1$ and low frequency is preferably selected such that $\omega_{LF}^2\tau^2 \ll 1$. In this case, the time constant is given by $$\tau = -\frac{1}{\omega_{HF}} \frac{G_a(\omega_{HF})}{G_a(\omega_{LF})} \frac{\text{Re}(\delta\sigma)_{LF}}{\text{Im}(\delta\sigma)_{HF}} \qquad (33)$$

However, if $\tau$ is too low or too high to achieve these conditions, $\omega_{HF}$ should be selected as high as possible and $\omega_{LF}$ as low as possible and the time constant should be determined using Eqs. (30) and (31).

The time constant, $\tau$, measured using the above procedure and a low probing intensity, represents the effective steady-state carrier recombination lifetime due to all recombination centers associated with both point and extended defects under background illumination. The knowledge of $\tau$ at $\omega^2_{LF}\tau^2 \ll 1$ allows for use of Eq. 30 to determine $\delta\sigma$ and hence carrier generation rate multiplied by effective carrier mobility $$\mu G_a(\omega_{LF}) = \frac{\text{Re}(\delta\sigma)_{LF}}{q\tau} \qquad (34)$$

The knowledge of $\tau$ at $\omega^2_{LF}\tau^2 \ll 1$ also allows for the determination of the real and imaginary components measured at the same variable frequency $\omega$ using Eqs. 30 and 31, $$\mu G_a = \frac{1}{q\tau}\sqrt{1+\omega^2\tau^2}\sqrt{\text{Re}(\delta\sigma)^2 + \text{Im}(\delta\sigma)^2} \qquad (35)$$

Unlike the first and second variations of the method set forth in detail above that require stopping motion of the wafer to perform photoconductance transient measurements, the third variant allows for photoconductance measurements without interruption of the wafer motion. This feature is particularly important for in-line monitoring of wafers or sheets used in, for example, "roll-to-roll" photovoltaic cell manufacturing. In the case of in-line monitoring applications, the area illuminated by the background light is preferably larger than probing area. The size of the background illumination area also needs to be sufficiently large in order for the probing beam to be within the illuminated area over the period corresponding to several (e.g., 3 to 5) carrier recombination lifetimes. The output time constants of the phase sensitive detector (lock-in) should be preferably set at about 3 to 5 carrier recombination lifetimes. This setup could be optimized by monitoring the dependence of the magnitude and phase of the output signal relative to the output time constant of the phase sensitive detector (lock-in). Once the output time constant of the phase sensitive detector (lock-in) is correctly setup, the magnitude and phase of the output signal would become independent of the output time constant.

In the case of a photovoltaic cell application, the intensity of the background illumination is preferably 100 mW/cm$^2$ (or 1 kW/m$^2$, one-sun of illumination). The use of such illumination allows for the review of the performance of the partially processed cell under standard photovoltaic cell operation conditions and, in turn, the eventual modification of the processing of the cell to optimize performance of the final product.

It is to be understood that the foregoing description is intended to illustrate and not to limit the scope of the invention, which is defined by the scope of the appended claims. Other embodiments are within the scope of the following claims.

What is claimed is:

1. A method for characterizing electronic properties of a semiconductor sample, the method comprising:
    illuminating the surface of the semiconductor sample with a background illumination having a predefined intensity and photon energy higher than an energy gap of the semiconductor;
    taking a first photoconductance measurement of the semiconductor sample to verify the establishment of a first state of steady-state photoconductance;
    illuminating the surface of the semiconductor sample with a probing pulse of light of a particular intensity, the probing pulse of light being superimposed over the background illumination;
    taking a second photoconductance measurement of the semiconductor sample to verify the presence of a second state of steady-state photoconductance;
    measuring a photoconductance rise and decay in the semiconductor sample after the cessation of the probing pulse of light; and
    analyzing the photoconductance to determine if the photoconductance rise and decay are substantially exponential.

2. The method of claim 1 further comprising the step of, if the photoconductance rise and decay are not substantially exponential, gradually reducing the particular intensity of the probing pulse of light until the measured photoconductance rise and decay are substantially exponential.

3. The method of claim 1 further comprising the step of, if the photoconductance rise and decay are not substantially exponential, gradually increasing the intensity of the background illumination intensity until the measured photoconductance rise and decay are substantially exponential.

4. The method of claim 1 wherein the intensity of the background illumination is approximately 100 mW/cm$^2$.

5. The method of claim 1 further comprising the step of determining the change in the steady-state photoconductance of the semiconductor sample in response to illumination of the semiconductor sample with the probing pulse of light.

6. The method of claim 1 wherein the intensity of the probing pulse of light is in the range of approximately 1% to 30% of the intensity of the background illumination.

7. The method of claim 5 wherein the intensity of the probing pulse of light is approximately 10% of the intensity of the background illumination.

8. The method of claim 1 further comprising the step of measuring a carrier lifetime in the semiconductor sample, wherein the analyzing step is utilized to validate the measured carrier lifetime.

9. The method of claim 8 wherein the probing illumination has two superimposed frequencies in order to optimize the signal-to-noise ratio of the real and imaginary components of the measured ac-photoconductance in the semiconductor sample.

10. The method of claim 8 further comprising the step of characterizing material properties in the semiconductor sample using a surface potential barrier in the semiconductor sample, the surface potential barrier being formed due to Fermi level pinning at the surface states in the semiconductor sample at fixed energy relative to conduction and valence band edges.

11. The method of claim 8 further comprising the step of characterizing material properties in the semiconductor sample using a surface potential barrier in the semiconductor sample, the surface potential barrier being formed due to the presence of inversion conditions at a surface of the semiconductor sample.

12. The method of claim 11 further comprising the step of, prior to the characterizing step, inducing the surface inversion conditions in the semiconductor sample to create the surface potential barrier.

13. A method for characterizing electronic properties of a semiconductor sample, the method comprising:
   illuminating the surface of the semiconductor sample with a continuous background illumination having a predefined intensity and photon energy higher than an energy gap of the semiconductor;
   illuminating the surface of the semiconductor sample with a continuous probing illumination that has a modulated intensity, the probing illumination being superimposed over the background illumination to yield a measurable alternating current photoconductance (ac-photoconductance) in the semiconductor sample, the measurable ac-photoconductance having real and imaginary components;
   setting the modulated intensity of the probing illumination such that the measurable ac-photoconductance in the semiconductor sample becomes linearly dependent on the modulated intensity of the probing illumination; and
   measuring the real and imaginary components of the ac-photoconductance in the semiconductor sample; and
   determining a steady-state carrier recombination lifetime for the semiconductor sample under background illumination using the measured real and imaginary components of the ac-photo conductance.

14. The method of claim 13 further comprising the step of determining a carrier generation rate for the semiconductor sample in response to the probing illumination using the measured real and imaginary components of the ac-photoconductance.

15. The method of claim 14 wherein the setting step is achieved by reducing the modulated intensity of the probing illumination until the measurable ac-photoconductance in the semiconductor sample becomes linearly dependent on the modulated intensity of the probing illumination.

16. The method of claim 15 further comprising the step of measuring a carrier lifetime in the semiconductor sample, wherein the setting step is utilized to validate the measured carrier lifetime.

* * * * *